(12) United States Patent
Kataoka et al.

(10) Patent No.: US 9,094,041 B2
(45) Date of Patent: Jul. 28, 2015

(54) ENCODING METHOD, INFORMATION PROCESSING APPARATUS, AND RECORDING MEDIUM

(71) Applicant: FUJITSU LIMITED, Kawasaki-shi, Kanagawa (JP)

(72) Inventors: Masahiro Kataoka, Tama (JP); Takahiro Murata, Yokohama (JP); Takafumi Ohta, Shinagawa (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 14/490,718

(22) Filed: Sep. 19, 2014

(65) Prior Publication Data

US 2015/0002320 A1    Jan. 1, 2015

Related U.S. Application Data

(63) Continuation of application No. PCT/JP2012/057079, filed on Mar. 19, 2012.

(51) Int. Cl.
*H03M 7/48* (2006.01)
*H03M 7/40* (2006.01)
*G06F 5/00* (2006.01)

(52) U.S. Cl.
CPC . *H03M 7/48* (2013.01); *G06F 5/00* (2013.01); *H03M 7/40* (2013.01)

(58) Field of Classification Search
CPC ............ H03M 7/40; H03M 7/46; H03M 7/48
See application file for complete search history.

(56) References Cited

U.S. PATENT DOCUMENTS

| | | | |
|---|---|---|---|
| 4,494,151 A * | 1/1985 | Liao | 341/63 |
| 4,811,113 A | 3/1989 | Ozeki et al. | |
| 5,138,673 A | 8/1992 | Yoshida et al. | |
| 5,463,699 A * | 10/1995 | Wilkinson | 382/246 |
| 2010/0131476 A1 | 5/2010 | Kataoka et al. | |
| 2013/0332433 A1* | 12/2013 | Kataoka | 707/700 |

FOREIGN PATENT DOCUMENTS

| | | |
|---|---|---|
| EP | 0412809 | 2/1991 |
| JP | 53-108217 | 9/1978 |
| JP | 62-298280 | 12/1987 |
| JP | 3-70268 | 3/1991 |
| JP | 6-112839 | 4/1994 |
| JP | 6-189145 | 7/1994 |
| JP | 11-317673 | 11/1999 |
| JP | 2000-165680 | 6/2000 |
| JP | 2005-260408 | 9/2005 |
| WO | 2008/146756 | 12/2008 |

OTHER PUBLICATIONS

International Search Report mailed in connection with PCT/JP2012/057079 and mailed Jun. 12, 2012 (2 pages).

\* cited by examiner

*Primary Examiner* — Howard Williams
(74) *Attorney, Agent, or Firm* — Fujitsu Patent Center

(57) ABSTRACT

A first encoding unit encodes, within the compression target data, each part with a sequence of the same value into the number of consecutive runs of the value. A decomposing unit decomposes the number of consecutive runs of the same value into an addition of integers belonging to a predetermined integer group. A calculating unit calculates the probability of occurrence of each integer obtained by the decomposition. A second encoding unit encodes each integer by assigning shorter codes to integers with higher probabilities of occurrence.

6 Claims, 33 Drawing Sheets

| RUN LENGTH | ENCODING UNIT BIT STRING | PROBABILITY OF OCCURRENCE | BIT LENGTH | REMAINING PROBABILITY |
|---|---|---|---|---|
| 0 | 1 | 1/2 | 1 | 1/2 |
| 1 | 01 | 1/4 | 2 | 1/4 |
| 2 | 001 | 1/8 | 3 | 1/8 |
| 3 | 0001 | 1/16 | 4 | 1/16 |
| 4 | 00001 | 1/32 | 5 | 1/32 |
| 5 | 000001 | 1/64 | 6 | 1/64 |
| 6 | 0000001 | 1/128 | 7 | 1/128 |
| 7 | 00000001 | 1/256 | 8 | 1/256 |
| 8 | 000000001 | 1/512 | 9 | 1/512 |
| 9 | 0000000001 | 1/1K | 10 | 1/1K |
| 10 | 00000000001 | 1/2K | 11 | 1/2K |
| 11 | 000000000001 | 1/4K | 12 | 1/4K |
| 12 | 0000000000001 | 1/8K | 13 | 1/8K |
| 13 | 00000000000001 | 1/16K | 14 | 1/16K |
| 14 | 000000000000001 | 1/32K | 15 | 1/32K |
| 15 | 0000000000000001 | 1/64K | 16 | 1/64K |
| 16 | 00000000000000001 | 1/128K | 17 | 1/128K |
| 17 | 000000000000000001 | 1/512K | 18 | 1/512K |
| 18 | 0000000000000000001 | 1/1M | 19 | 1/1M |
| 19 | 00000000000000000001 | 1/2M | 20 | 1/2M |
| 20 | 000000000000000000001 | 1/4M | 21 | 1/4M |
| 21 | 0000000000000000000001 | 1/8M | 22 | 1/8M |
| 22 | 00000000000000000000001 | 1/16M | 23 | 1/16M |
| 23 | 000000000000000000000001 | 1/32M | 24 | 1/32M |
| 24 | 0000000000000000000000001 | 1/64M | 25 | 1/64M |
| 25 | 00000000000000000000000001 | 1/128M | 26 | 1/128M |
| 26 | 000000000000000000000000001 | 1/512M | 27 | 1/512M |
| 27 | 0000000000000000000000000001 | 1/1G | 28 | 1/1G |
| 28 | 00000000000000000000000000001 | 1/2G | 29 | 1/2G |
| 29 | 000000000000000000000000000001 | 1/4G | 30 | 1/4G |
| 30 | 0000000000000000000000000000001 | 1/8G | 31 | 1/8G |
| 31 | 00000000000000000000000000000001 | 1/16G | 32 | 1/16G |
| 32 | 000000000000000000000000000000001 | 1/32G | 33 | 1/32G |
| ... | ......... | ... | | |
| END | [EOB] | | | |

FIG. 9

| SYMBOL | NUMBER OF 0'S | EXPONENTIAL FORM | BIT STRING PATTERN |
|---|---|---|---|
| α | 0 | — | 1 |
| β | 1 | $2^0$ | 01 |
| 1 | 2 | $2^1$ | 00+ |
| 2 | 4 | $2^2$ | 0000+ |
| 3 | 8 | $2^3$ | 00000000+ |
| 4 | 16 | $2^4$ | 0000000000000000+ |
| 5 | 32 | $2^5$ | 00000000000000000000000000000000+ |
| 6 | 64 | $2^6$ | 0000000000000000000000000000000000000000000000000000000000000000+ |
| 7 | 128 | $2^7$ | 0(128)+ |
| 8 | 256 | $2^8$ | 0(256)+ |
| 9 | 512 | $2^9$ | 0(512)+ |
| 10 | 1024 | $2^{10}$ | 0(1024)+ |
| 11 | 2048 | $2^{11}$ | 0(2048)+ |
| 12 | 4096 | $2^{12}$ | 0(4096)+ |
| 13 | 8192 | $2^{13}$ | 0(8192)+ |
| ... | ... | ... | ...... |
| END | [EOB] | [EOB] | |

FIG. 10

| RUN LENGTH | ENCODING UNIT BIT STRING | SYMBOL STRING | PROBABILITY OF OCCURRENCE | BIT LENGTH | REMAINING PROBABILITY |
|---|---|---|---|---|---|
| 0 | 1 | α | 1/2 | 1 | 1/2 |
| 1 | 01 | β | 1/4 | 2 | 1/4 |
| 2 | 001 | 1α | 1/8 | 3 | 1/8 |
| 3 | 0001 | 1β | 1/16 | 4 | 1/16 |
| 4 | 00001 | 2α | 1/32 | 5 | 1/32 |
| 5 | 000001 | 2β | 1/64 | 6 | 1/64 |
| 6 | 0000001 | 21α | 1/128 | 7 | 1/128 |
| 7 | 00000001 | 21β | 1/256 | 8 | 1/256 |
| 8 | 000000001 | 3α | 1/512 | 9 | 1/512 |
| 9 | 0000000001 | 3β | 1/1K | 10 | 1/1K |
| 10 | 00000000001 | 31α | 1/2K | 11 | 1/2K |
| 11 | 000000000001 | 31β | 1/4K | 12 | 1/4K |
| 12 | 0000000000001 | 32α | 1/8K | 13 | 1/8K |
| 13 | 00000000000001 | 32β | 1/16K | 14 | 1/16K |
| 14 | 000000000000001 | 321α | 1/32K | 15 | 1/32K |
| 15 | 0000000000000001 | 321β | 1/64K | 16 | 1/64K |
| 16 | 00000000000000001 | 4α | 1/128K | 17 | 1/128K |
| 17 | 000000000000000001 | 4β | 1/512K | 18 | 1/512K |
| 18 | 0000000000000000001 | 41α | 1/1M | 19 | 1/1M |
| 19 | 00000000000000000001 | 41β | 1/2M | 20 | 1/2M |
| 20 | 000000000000000000001 | 42α | 1/4M | 21 | 1/4M |
| 21 | 0000000000000000000001 | 42β | 1/8M | 22 | 1/8M |
| 22 | 00000000000000000000001 | 421α | 1/16M | 23 | 1/16M |
| 23 | 000000000000000000000001 | 421β | 1/32M | 24 | 1/32M |
| 24 | 0000000000000000000000001 | 43α | 1/64M | 25 | 1/64M |
| 25 | 00000000000000000000000001 | 43β | 1/128M | 26 | 1/128M |
| 26 | 000000000000000000000000001 | 431α | 1/512M | 27 | 1/512M |
| 27 | 0000000000000000000000000001 | 431β | 1/1G | 28 | 1/1G |
| 28 | 00000000000000000000000000001 | 432α | 1/2G | 29 | 1/2G |
| 29 | 000000000000000000000000000001 | 432β | 1/4G | 30 | 1/4G |
| 30 | 0000000000000000000000000000001 | 4321α | 1/8G | 31 | 1/8G |
| 31 | 00000000000000000000000000000001 | 4321β | 1/16G | 32 | 1/16G |
| 32 | 000000000000000000000000000000001 | 5α | 1/32G | 33 | 1/32G |
| ... | ........ | | ... | | |
| END | [EOB] | | | | |

FIG. 11

142 BITMAP

| CHARACTER TYPE | CHAR-ACTER | G-ID | | | | | | |
|---|---|---|---|---|---|---|---|---|
| | | 1 | 2 | 3 | ... | i | ... | n |
| HIRAGANA | あ | 1 | 1 | 1 | ... | 0 | ... | 1 |
| | ... | ... | | | | | | |
| | ん | 1 | 1 | 1 | ... | 1 | ... | 0 |
| KATAKANA | ア | 1 | 0 | 1 | ... | 1 | ... | 0 |
| | ... | ... | | | | | | |
| | ン | 0 | 0 | 1 | ... | 0 | ... | 1 |
| NUMERIC CHARACTER | 0 | 1 | 1 | 1 | ... | 0 | ... | 1 |
| | ... | ... | | | | | | |
| | 9 | 0 | 1 | 0 | ... | 0 | ... | 1 |
| ALPHABET (UPPER CASE) | A | 0 | 0 | 0 | ... | 1 | ... | 0 |
| | ... | ... | | | | | | |
| | Z | 0 | 1 | 0 | ... | 0 | ... | 0 |
| ALPHABET (LOWER CASE) | a | 1 | 0 | 0 | ... | 1 | ... | 0 |
| | ... | ... | | | | | | |
| | z | 0 | 0 | 0 | ... | 0 | ... | 1 |
| KANJI | 亜 | 0 | 1 | 0 | ... | 0 | ... | 0 |
| | ... | ... | | | | | | |
| EXTERNAL CHARACTER | ... | ... | | | | | | |

FIG. 15

141 INDEX
141a
143 MANAGEMENT INFORMATION

| CHARACTER TYPE | CHAR-ACTER | SYMBOL STRING | OCCUR-RENCE RATE | REGION |
|---|---|---|---|---|
| HIRAGANA | あ | 2β1α··· | 0.673 | A' |
| | ··· | ··· | ··· | ··· |
| | ん | 21α··· | 0.815 | B' |
| KATAKANA | ア | β1α··· | 0.041 | D |
| | ··· | ··· | ··· | ··· |
| | ン | 1α··· | 0.297 | A |
| NUMERIC CHARACTER | 0 | 4α··· | 0.907 | C' |
| | ··· | ··· | ··· | ··· |
| | 9 | β1α··· | 0.541 | A' |
| ALPHABET (UPPER CASE) | A | 32β··· | 0.289 | A |
| | ··· | ··· | ··· | ··· |
| | Z | β321α··· | 0.114 | C |
| ALPHABET (LOWER CASE) | a | α2β··· | 0.316 | A |
| | ··· | ··· | ··· | ··· |
| | z | 2α··· | 0.157 | B |
| KANJI | 亜 | β31α··· | 0.130 | B |
| | ··· | ··· | ··· | ··· |
| EXTERNAL CHARACTER | ··· | ··· | ··· | ··· |

FIG. 17

REGION A    OCCURRENCE RATE OF '1': 0.25 to 0.5

| SYMBOL | BIT STRING PATTERN | NUMBER OF OCCURRENCES | PROBABILITY OF OCCURRENCE | CORRECTED PROBABILITY | REMAINING PROBABILITY | COMPRESSED CODE LENGTH | COMPRESSED CODE |
|---|---|---|---|---|---|---|---|
| α | 1 | 768338 | 0.5203 | 1/2 | 1/2 | 1 | 0 |
| β | 01 | ... | ... | 1/4 | 1/4 | 2 | 10 |
| 1 | 00+ | | | 1/8 | 1/8 | 3 | 110 |
| 2 | 0000+ | | | 1/16 | 1/16 | 4 | 1110 |
| 3 | 0(8)+ | | | 1/32 | 1/32 | 5 | 11110 |
| 4 | 0(16)+ | | | 1/64 | 1/64 | 6 | 111110 |
| 5 | 0(32)+ | | | 1/128 | 1/128 | 7 | 1111110 |
| 6 | 0(64)+ | | | 1/256 | 1/256 | 8 | 11111110 |
| END | EOB | | | 1/256 | 0 | 8 | 11111111 |

FIG. 20

REGION D    OCCURRENCE RATE OF '1': 0.0315 to 0.0625

| SYMBOL | BIT STRING PATTERN | NUMBER OF OCCURRENCES | PROBABILITY OF OCCURRENCE | CORRECTED PROBABILITY | REMAINING PROBABILITY | COMPRESSED CODE LENGTH | COMPRESSED CODE |
|---|---|---|---|---|---|---|---|
| α | 1 | … | … | 1/16 | 1/16 | 4 | 1110 |
| β | 01 | 529470 | 0.5147 | 1/32 | 1/32 | 5 | 11110 |
| 1 | 00+ | … | … | 1/16 | 3/16 | 4 | 1100 |
| 2 | 0000+ | | | 1/8 | 3/8 | 3 | 100 |
| 3 | 0(8)+ | | | 1/2 | 1/2 | 1 | 0 |
| 4 | 0(16)+ | | | 1/8 | 1/4 | 3 | 101 |
| 5 | 0(32)+ | | | 1/16 | 1/8 | 4 | 1101 |
| 6 | 0(64)+ | | | 1/64 | 1/64 | 6 | 111110 |
| END | EOB | | | 1/64 | 0 | 6 | 111111 |

FIG. 22

141 INDEX

| CHARACTER TYPE | CHAR-ACTER | COMPRESSED CODE STRING |
|---|---|---|
| HIRAGANA | あ | 111010··· |
| | ··· | ··· |
| | ん | 111··· |
| KATAKANA | ア | 10110··· |
| | ··· | ··· |
| | ン | 110··· |
| NUMERIC CHARACTER | 0 | 101··· |
| | ··· | ··· |
| | 9 | 10110··· |
| ALPHABET (UPPER CASE) | A | 11110111010··· |
| | ··· | ··· |
| | Z | 100··· |
| ALPHABET (LOWER CASE) | a | 0111010··· |
| | ··· | ··· |
| | z | 111··· |
| KANJI | 亜 | 110··· |
| | ··· | ··· |
| EXTERNAL CHARACTER | ··· | ··· |

FIG. 23

REGION A

| SYMBOL | BIT LENGTH | NUMBER OF OCCURRENCES | BIT SIZE | PROBABILITY OF OCCURRENCE | WITHOUT SECOND-ORDER CORRECTION | | | WITH SECOND-ORDER CORRECTION | | |
|---|---|---|---|---|---|---|---|---|---|---|
| | | | | | CORRECTED PROBABILITY | CODE LENGTH | CODE SIZE | CORRECTED PROBABILITY | CODE LENGTH | CODE SIZE |
| α | 1 | 769338 | 769338 | 0.5203 | 0.5000 | 1 | 769338 | 0.5000 | 1 | 769338 |
| β | 2 | 336912 | 673824 | 0.2278 | 0.1250 | 3 | 1010736 | 0.2500 | 2 | 673824 |
| 1 | 2 | 222274 | 444548 | 0.1503 | 0.1250 | 3 | 666822 | 0.1250 | 3 | 666822 |
| 2 | 4 | 103093 | 412372 | 0.0697 | 0.0625 | 4 | 412372 | 0.0625 | 4 | 412372 |
| 3 | 8 | 31863 | 254904 | 0.0215 | 0.0156 | 6 | 191178 | 0.0313 | 5 | 159315 |
| 4 | 16 | 9205 | 147280 | 0.0062 | 0.0039 | 8 | 73640 | 0.0078 | 7 | 64435 |
| 5 | 32 | 3534 | 113088 | 0.0024 | 0.0020 | 9 | 31806 | 0.0039 | 8 | 28272 |
| 6 | 64 | 1444 | 92416 | 0.0010 | 0.0010 | 10 | 14440 | 0.0039 | 8 | 11552 |
| 7 | 128 | 695 | 88960 | 0.0005 | 0.0005 | 11 | 7645 | 0.0039 | 8 | 5560 |
| 8 | 256 | 344 | 88064 | 0.0002 | 0.0002 | 12 | 4128 | 0.0039 | 8 | 2752 |
| 9 | 512 | 56 | 28672 | 0.0000 | 0.0000 | 15 | 840 | 0.0020 | 9 | 504 |
| 10 | 1024 | 7 | 7168 | 0.0000 | 0.0000 | 15 | 105 | 0.0020 | 9 | 63 |
| 11 | 2048 | 1 | 2048 | 0.0000 | 0.0000 | 15 | 15 | 0.0020 | 9 | 9 |
| 12 | 4096 | 0 | 0 | 0.0000 | 0.0000 | 15 | 0 | 0.0000 | 15 | 0 |
| 13 | 8192 | 0 | 0 | 0.0000 | 0.0000 | 15 | 0 | 0.0000 | 15 | 0 |
| TOTAL | | 1478766 | 3122682 | | 0.8358 | | 3183065 | 0.9981 | | 2794818 |
| | | | | | COMPRESSIBILITY | | 1.019337 | COMPRESSIBILITY | | 0.895006 |

FIG. 26

| REGION B | | | | | WITHOUT SECOND-ORDER CORRECTION | | | WITH SECOND-ORDER CORRECTION | | |
|---|---|---|---|---|---|---|---|---|---|---|
| SYMBOL | BIT LENGTH | NUMBER OF OCCURRENCES | BIT SIZE | PROBABILITY OF OCCURRENCE | CORRECTED PROBABILITY | CODE LENGTH | CODE SIZE | CORRECTED PROBABILITY | CODE LENGTH | CODE SIZE |
| α | 1 | 477667 | 477667 | 0.3477 | 0.2500 | 2 | 955334 | 0.2500 | 2 | 955334 |
| β | 2 | 314244 | 628488 | 0.2287 | 0.1250 | 3 | 942732 | 0.2500 | 2 | 628488 |
| 1 | 2 | 261356 | 522712 | 0.1902 | 0.1250 | 3 | 784068 | 0.2500 | 2 | 522712 |
| 2 | 4 | 182306 | 729224 | 0.1327 | 0.1250 | 3 | 546918 | 0.1250 | 3 | 546918 |
| 3 | 8 | 93709 | 749672 | 0.0682 | 0.0625 | 4 | 374836 | 0.0625 | 4 | 374836 |
| 4 | 16 | 31010 | 496160 | 0.0226 | 0.0156 | 6 | 186060 | 0.0313 | 5 | 155050 |
| 5 | 32 | 8298 | 265536 | 0.0060 | 0.0039 | 8 | 66384 | 0.0156 | 6 | 49788 |
| 6 | 64 | 3110 | 199040 | 0.0023 | 0.0020 | 9 | 27990 | 0.0039 | 8 | 24880 |
| 7 | 128 | 1269 | 162432 | 0.0009 | 0.0005 | 11 | 13959 | 0.0010 | 10 | 12690 |
| 8 | 256 | 637 | 163072 | 0.0005 | 0.0005 | 11 | 7007 | 0.0005 | 11 | 7007 |
| 9 | 512 | 210 | 107520 | 0.0002 | 0.0001 | 13 | 2730 | 0.0005 | 11 | 2310 |
| 10 | 1024 | 32 | 32768 | 0.0000 | 0.0000 | 15 | 480 | 0.0001 | 13 | 416 |
| 11 | 2048 | 6 | 12288 | 0.0000 | 0.0000 | 15 | 90 | 0.0001 | 13 | 78 |
| 12 | 4096 | 0 | 0 | 0.0000 | 0.0000 | 15 | 0 | 0.0000 | 15 | 0 |
| 13 | 8192 | 0 | 0 | 0.0000 | 0.0000 | 15 | 0 | 0.0000 | 15 | 0 |
| TOTAL | | 1373854 | 4546579 | | 0.7102 | | 3908588 | 0.9905 | | 3280507 |
| | | | | | COMPRESSIBILITY | | 0.859677 | COMPRESSIBILITY | | 0.721533 |

| REGION C | | | | | WITHOUT SECOND-ORDER CORRECTION | | | WITH SECOND-ORDER CORRECTION | | |
|---|---|---|---|---|---|---|---|---|---|---|
| SYMBOL | | BIT LENGTH | NUMBER OF OCCURRENCES | BIT SIZE | PROBABILITY OF OCCURRENCE | CORRECTED PROBABILITY | CODE LENGTH | CODE SIZE | CORRECTED PROBABILITY | CODE LENGTH | CODE SIZE |
| α | | 1 | 297282 | 297282 | 0.2627 | 0.2500 | 2 | 594564 | 0.2500 | 2 | 594564 |
| β | | 2 | 231409 | 462818 | 0.2045 | 0.1250 | 3 | 694227 | 0.2500 | 2 | 462818 |
| 1 | | 2 | 208336 | 416672 | 0.1841 | 0.1250 | 3 | 625008 | 0.2500 | 2 | 416672 |
| 2 | | 4 | 174104 | 696416 | 0.1539 | 0.1250 | 3 | 522312 | 0.1250 | 3 | 522312 |
| 3 | | 8 | 124163 | 993304 | 0.1097 | 0.0625 | 4 | 496652 | 0.0625 | 4 | 496652 |
| 4 | | 16 | 65187 | 1042992 | 0.0576 | 0.0313 | 5 | 325935 | 0.0313 | 5 | 325935 |
| 5 | | 32 | 21562 | 689984 | 0.0191 | 0.0156 | 6 | 129372 | 0.0156 | 6 | 129372 |
| 6 | | 64 | 5961 | 381504 | 0.0053 | 0.0039 | 8 | 47688 | 0.0078 | 7 | 41727 |
| 7 | | 128 | 2186 | 279808 | 0.0019 | 0.0010 | 10 | 21860 | 0.0020 | 9 | 19674 |
| 8 | | 256 | 898 | 229888 | 0.0008 | 0.0005 | 11 | 9878 | 0.0010 | 10 | 8980 |
| 9 | | 512 | 388 | 198656 | 0.0003 | 0.0002 | 12 | 4656 | 0.0010 | 10 | 3880 |
| 10 | | 1024 | 68 | 69632 | 0.0001 | 0.0001 | 13 | 884 | 0.0010 | 10 | 680 |
| 11 | | 2048 | 24 | 49152 | 0.0000 | 0.0000 | 15 | 360 | 0.0010 | 10 | 240 |
| 12 | | 4096 | 0 | 0 | 0.0000 | 0.0000 | 15 | 0 | 0.0000 | 15 | 0 |
| 13 | | 8192 | 0 | 0 | 0.0000 | 0.0000 | 15 | 0 | 0.0000 | 15 | 0 |
| | TOTAL | | 1131568 | 5808108 | | 0.7402 | | 3473396 | 0.9981 | | 3023506 |
| | | | | | | COMPRESSIBILITY | | 0.598025 | COMPRESSIBILITY | | 0.520566 |

| REGION D | | | | WITHOUT SECOND-ORDER CORRECTION | | | WITH SECOND-ORDER CORRECTION | | |
|---|---|---|---|---|---|---|---|---|---|
| SYMBOL | BIT LENGTH | NUMBER OF OCCURRENCES | BIT SIZE | PROBABILITY OF OCCURRENCE | CORRECTED PROBABILITY | CODE LENGTH | CODE SIZE | CORRECTED PROBABILITY | CODE LENGTH | CODE SIZE |
| α | 1 | 148779 | 148779 | 0.2104 | 0.1250 | 3 | 446337 | 0.2500 | 2 | 297558 |
| β | 2 | 123993 | 247986 | 0.1753 | 0.1250 | 3 | 371979 | 0.2500 | 2 | 247986 |
| 1 | 2 | 116997 | 233994 | 0.1654 | 0.1250 | 3 | 350991 | 0.1250 | 3 | 350991 |
| 2 | 4 | 106205 | 424820 | 0.1502 | 0.1250 | 3 | 318615 | 0.1250 | 3 | 318615 |
| 3 | 8 | 89976 | 719808 | 0.1272 | 0.1250 | 3 | 269928 | 0.1250 | 3 | 269928 |
| 4 | 16 | 66334 | 1061344 | 0.0938 | 0.0625 | 4 | 265336 | 0.0625 | 4 | 265336 |
| 5 | 32 | 36656 | 1172992 | 0.0518 | 0.0313 | 5 | 183280 | 0.0313 | 5 | 183280 |
| 6 | 64 | 12993 | 831552 | 0.0184 | 0.0156 | 6 | 77958 | 0.0156 | 6 | 77958 |
| 7 | 128 | 3434 | 439552 | 0.0049 | 0.0039 | 8 | 27472 | 0.0039 | 8 | 27472 |
| 8 | 256 | 1185 | 303360 | 0.0017 | 0.0010 | 10 | 11850 | 0.0039 | 8 | 9480 |
| 9 | 512 | 476 | 243712 | 0.0007 | 0.0005 | 11 | 5236 | 0.0020 | 9 | 4284 |
| 10 | 1024 | 85 | 87040 | 0.0001 | 0.0001 | 13 | 1105 | 0.0020 | 9 | 765 |
| 11 | 2048 | 76 | 155648 | 0.0001 | 0.0001 | 13 | 988 | 0.0020 | 9 | 684 |
| 12 | 4096 | 1 | 4096 | 0.0000 | 0.0000 | 15 | 15 | 0.0005 | 11 | 11 |
| 13 | 8192 | 1 | 8192 | 0.0000 | 0.0000 | 15 | 15 | 0.0005 | 11 | 11 |
| TOTAL | | 707191 | 6082875 | | 0.7401 | | 2331105 | 0.9990 | | 2054359 |
| | | | | | COMPRESSIBILITY | | 0.383224 | COMPRESSIBILITY | | 0.337728 |

FIG. 29

| REGION E | | | | | WITHOUT SECOND-ORDER CORRECTION | | | WITH SECOND-ORDER CORRECTION | | |
|---|---|---|---|---|---|---|---|---|---|---|
| SYMBOL | | BIT LENGTH | NUMBER OF OCCURRENCES | BIT SIZE | PROBABILITY OF OCCURRENCE | CORRECTED PROBABILITY | CODE LENGTH | CODE SIZE | CORRECTED PROBABILITY | CODE LENGTH | CODE SIZE |
| α | | 1 | 71287 | 71287 | 0.1791 | 0.1250 | 3 | 213861 | 0.2500 | 2 | 142574 |
| β | | 2 | 60927 | 121854 | 0.1530 | 0.1250 | 3 | 182781 | 0.1250 | 3 | 182781 |
| | 1 | 2 | 58746 | 117492 | 0.1476 | 0.1250 | 3 | 176238 | 0.1250 | 3 | 176238 |
| | 2 | 4 | 55072 | 220288 | 0.1383 | 0.1250 | 3 | 165216 | 0.1250 | 3 | 165216 |
| | 3 | 8 | 50243 | 401944 | 0.1262 | 0.1250 | 3 | 150729 | 0.1250 | 3 | 150729 |
| | 4 | 16 | 42833 | 685328 | 0.1076 | 0.1250 | 3 | 171332 | 0.1250 | 3 | 128499 |
| | 5 | 32 | 31941 | 1022112 | 0.0802 | 0.0625 | 4 | 127764 | 0.0625 | 4 | 127764 |
| | 6 | 64 | 18066 | 1156224 | 0.0454 | 0.0313 | 5 | 90330 | 0.0313 | 5 | 90330 |
| | 7 | 128 | 6424 | 822272 | 0.0161 | 0.0156 | 6 | 38544 | 0.0156 | 6 | 38544 |
| | 8 | 256 | 1708 | 437248 | 0.0043 | 0.0039 | 8 | 13664 | 0.0078 | 7 | 11956 |
| | 9 | 512 | 624 | 319488 | 0.0016 | 0.0010 | 10 | 6240 | 0.0010 | 10 | 6240 |
| | 10 | 1024 | 134 | 137216 | 0.0003 | 0.0002 | 12 | 1608 | 0.0002 | 12 | 1608 |
| | 11 | 2048 | 120 | 245760 | 0.0003 | 0.0002 | 12 | 1440 | 0.0002 | 12 | 1440 |
| | 12 | 4096 | 2 | 8192 | 0.0000 | 0.0001 | 14 | 28 | 0.0001 | 14 | 28 |
| | 13 | 8192 | 2 | 16384 | 0.0000 | 0.0001 | 14 | 28 | 0.0001 | 14 | 28 |
| TOTAL | | | 398129 | 5783089 | | 0.8024 | | 1339803 | 0.9938 | | 1223975 |
| | | | | | | COMPRESSIBILITY | | 0.231676 | COMPRESSIBILITY | | 0.211647 |

FIG. 30

| REGION F | | | | | WITHOUT SECOND-ORDER CORRECTION | | | WITH SECOND-ORDER CORRECTION | | |
|---|---|---|---|---|---|---|---|---|---|---|
| SYMBOL | BIT LENGTH | NUMBER OF OCCURRENCES | BIT SIZE | PROBABILITY OF OCCURRENCE | CORRECTED PROBABILITY | CODE LENGTH | CODE SIZE | CORRECTED PROBABILITY | CODE LENGTH | CODE SIZE |
| α | 1 | 37412 | 37412 | 0.1506 | 0.1250 | 3 | 112236 | 0.2500 | 2 | 74824 |
| β | 2 | 33386 | 66772 | 0.1344 | 0.1250 | 3 | 100158 | 0.1250 | 3 | 100158 |
| 1 | 2 | 32484 | 64968 | 0.1308 | 0.1250 | 3 | 97452 | 0.1250 | 3 | 97452 |
| 2 | 4 | 31012 | 124048 | 0.1248 | 0.0625 | 4 | 124048 | 0.1250 | 3 | 93036 |
| 3 | 8 | 29795 | 238360 | 0.1199 | 0.0625 | 4 | 119180 | 0.0625 | 4 | 119180 |
| 4 | 16 | 27159 | 434544 | 0.1093 | 0.0625 | 4 | 108636 | 0.0625 | 4 | 108636 |
| 5 | 32 | 23395 | 748640 | 0.0942 | 0.0625 | 4 | 93580 | 0.0625 | 4 | 93580 |
| 6 | 64 | 17978 | 1150592 | 0.0724 | 0.0625 | 4 | 71912 | 0.0625 | 4 | 71912 |
| 7 | 128 | 10571 | 1353088 | 0.0426 | 0.0313 | 5 | 52855 | 0.0625 | 4 | 42284 |
| 8 | 256 | 3892 | 996352 | 0.0157 | 0.0156 | 6 | 23352 | 0.0313 | 5 | 19460 |
| 9 | 512 | 921 | 471552 | 0.0037 | 0.0078 | 7 | 6447 | 0.0156 | 6 | 5526 |
| 10 | 1024 | 187 | 191488 | 0.0008 | 0.0078 | 7 | 1309 | 0.0078 | 7 | 1309 |
| 11 | 2048 | 202 | 413696 | 0.0008 | 0.0039 | 8 | 1616 | 0.0039 | 8 | 1616 |
| 12 | 4096 | 3 | 4096 | 0.0000 | 0.0010 | 10 | 10 | 0.0010 | 10 | 10 |
| 13 | 8192 | 1 | 24576 | 0.0000 | 0.0005 | 11 | 33 | 0.0005 | 11 | 33 |
| TOTAL | | 248398 | 6320184 | | 0.7554 | | 912824 | 0.9976 | | 829016 |
| | | | | | COMPRESSIBILITY | | 0.14443 | COMPRESSIBILITY | | 0.13117 |

FIG. 31

| REGION G | | | | | WITHOUT SECOND-ORDER CORRECTION | | | WITH SECOND-ORDER CORRECTION | | |
|---|---|---|---|---|---|---|---|---|---|---|
| SYMBOL | BIT LENGTH | NUMBER OF OCCURRENCES | BIT SIZE | PROBABILITY OF OCCURRENCE | CORRECTED PROBABILITY | CODE LENGTH | CODE SIZE | CORRECTED PROBABILITY | CODE LENGTH | CODE SIZE |
| α | 1 | 19338 | 19338 | 0.1308 | 0.1250 | 3 | 58014 | 0.2500 | 2 | 38676 |
| β | 2 | 17806 | 35612 | 0.1204 | 0.0625 | 4 | 71224 | 0.1250 | 3 | 53418 |
| 1 | 2 | 17308 | 34616 | 0.1170 | 0.0625 | 4 | 69232 | 0.1250 | 3 | 51924 |
| 2 | 4 | 16854 | 67416 | 0.1140 | 0.0625 | 4 | 67416 | 0.1250 | 3 | 50562 |
| 3 | 8 | 16200 | 129600 | 0.1096 | 0.0625 | 4 | 64800 | 0.0625 | 4 | 64800 |
| 4 | 16 | 15315 | 245040 | 0.1036 | 0.0625 | 4 | 61260 | 0.0625 | 4 | 61260 |
| 5 | 32 | 14193 | 454176 | 0.0960 | 0.0625 | 4 | 56772 | 0.0625 | 4 | 56772 |
| 6 | 64 | 12353 | 790592 | 0.0835 | 0.0625 | 4 | 49412 | 0.0625 | 4 | 49412 |
| 7 | 128 | 9753 | 1248384 | 0.0660 | 0.0625 | 4 | 39012 | 0.0625 | 4 | 39012 |
| 8 | 256 | 5971 | 1528576 | 0.0404 | 0.0313 | 5 | 29855 | 0.0313 | 5 | 29855 |
| 9 | 512 | 2064 | 1056768 | 0.0140 | 0.0078 | 7 | 14448 | 0.0156 | 6 | 12384 |
| 10 | 1024 | 413 | 422912 | 0.0028 | 0.0020 | 9 | 3717 | 0.0078 | 7 | 2891 |
| 11 | 2048 | 303 | 620544 | 0.0020 | 0.0020 | 9 | 2727 | 0.0039 | 8 | 2424 |
| 12 | 4096 | 2 | 8192 | 0.0000 | 0.0005 | 11 | 22 | 0.0010 | 10 | 20 |
| 13 | 8192 | 1 | 8192 | 0.0000 | 0.0005 | 11 | 11 | 0.0005 | 11 | 11 |
| TOTAL | | 147874 | 6669958 | | 0.6689 | | 587922 | 0.9976 | | 513421 |
| | | | | | COMPRESSIBILITY | | 0.088145 | COMPRESSIBILITY | | 0.076975 |

FIG. 32

| REGION H | | | | | WITHOUT SECOND-ORDER CORRECTION | | | WITH SECOND-ORDER CORRECTION | | |
|---|---|---|---|---|---|---|---|---|---|---|
| SYMBOL | BIT LENGTH | NUMBER OF OCCURRENCES | BIT SIZE | PROBABILITY OF OCCURRENCE | CORRECTED PROBABILITY | CODE LENGTH | CODE SIZE | CORRECTED PROBABILITY | CODE LENGTH | CODE SIZE |
| α | 1 | 22066 | 22066 | 0.1008 | 0.0625 | 4 | 88264 | 0.1250 | 3 | 66198 |
| β | 2 | 20246 | 40492 | 0.0925 | 0.0625 | 4 | 80984 | 0.1250 | 3 | 60738 |
| 1 | 2 | 21626 | 43252 | 0.0988 | 0.0625 | 4 | 86504 | 0.1250 | 3 | 64878 |
| 2 | 4 | 20773 | 83092 | 0.0949 | 0.0625 | 4 | 83092 | 0.1250 | 3 | 62319 |
| 3 | 8 | 20234 | 161872 | 0.0925 | 0.0625 | 4 | 80936 | 0.0625 | 4 | 80936 |
| 4 | 16 | 19472 | 311552 | 0.0890 | 0.0625 | 4 | 77888 | 0.0625 | 4 | 77888 |
| 5 | 32 | 18904 | 604928 | 0.0864 | 0.0625 | 4 | 75616 | 0.0625 | 4 | 75616 |
| 6 | 64 | 17939 | 1148096 | 0.0820 | 0.0625 | 4 | 71756 | 0.0625 | 4 | 71756 |
| 7 | 128 | 16853 | 2157184 | 0.0770 | 0.0625 | 4 | 67412 | 0.0625 | 4 | 67412 |
| 8 | 256 | 14748 | 3775488 | 0.0674 | 0.0625 | 4 | 58992 | 0.0625 | 4 | 58992 |
| 9 | 512 | 11122 | 5694464 | 0.0508 | 0.0313 | 5 | 55610 | 0.0625 | 4 | 44488 |
| 10 | 1024 | 7427 | 7605248 | 0.0339 | 0.0313 | 5 | 37135 | 0.0313 | 5 | 37135 |
| 11 | 2048 | 5400 | 11059200 | 0.0247 | 0.0156 | 6 | 32400 | 0.0156 | 6 | 32400 |
| 12 | 4096 | 1068 | 4374528 | 0.0049 | 0.0039 | 8 | 8544 | 0.0039 | 8 | 8544 |
| 13 | 8192 | 935 | 7659520 | 0.0043 | 0.0039 | 8 | 7480 | 0.0039 | 8 | 7480 |
| TOTAL | | 218813 | 44740982 | | 0.7109 | | 912613 | 0.9922 | | 816780 |
| | | | | | COMPRESSIBILITY | | 0.020398 | COMPRESSIBILITY | | 0.018256 |

FIG. 33

ENCODING METHOD, INFORMATION PROCESSING APPARATUS, AND RECORDING MEDIUM

CROSS-REFERENCE TO RELATED APPLICATION

This application is a continuation application of International Application PCT/JP2012/057079 filed on Mar. 19, 2012 which designated the U.S., the entire contents of which are incorporated herein by reference.

FIELD

The embodiments discussed herein are related to an encoding method, an information processing apparatus, and a recording medium.

BACKGROUND

A technique using a bitmap index is known as one method of speeding up document retrieval. The index represents, in a bitmap, for example, whether each character representable by a predetermined character code is included in each of a plurality of documents. For example, in the bitmap, for each of such characters, 1 is set in the location of the document number of each document including the character, and 0 is set in the location of the document number of each document not including the character. This creates a bit string for each character, indicating the presence and absence of the character in the individual documents using 1's and 0's.

There is a technique of performing Huffman compression on bit strings each indicating the presence and absence of a character. For example, a data compression apparatus has been proposed which calculates the frequency of occurrence of the character for every four bits (one digit) or every eight bits (one byte) and applies entropy coding for every four (or eight) bits.

In addition, a bit string compression technique has been proposed which uses a special Huffman tree with leaves for sixteen types of symbol strings corresponding to all patterns represented with four bits and special symbol strings whose bit number is larger than 4.

On the other hand, bit strings are compressed by employing run length encoding (RLE) used to compress character strings. RLE represents, for example, data with sequences in each of which the same character occurs in consecutive data elements by each character of the sequence and the number of its consecutive runs (run length). In the case where data contains only two types, 0 and 1, a bit string is represented by alternately arranging the run length of one type (e.g., 0 and the run length of the other type (e.g., 1)).

Japanese Laid-open Patent Publication No. 2005-260408
International Publication Pamphlet No. WO2008/146756

However, sufficient compression effects may not be achieved by compressing a bitmap including consecutive runs of the same value using a simple combination of RLE and entropy coding. The same value in such sequences is 0 in the case of, for example, a bitmap for kanji characters (Chinese characters used in Japanese language). In RLE, for example, consecutive runs of the same value may occur with low frequency, thus creating small deviations. On the other hand, entropy coding is a coding system offering higher compressibility when there are larger deviations in the probabilities of occurrence of codes to be compressed. Therefore, sufficient compression effects may not be achieved by applying entropy coding directly to codes obtained by RLE.

SUMMARY

According to an aspect, there is provided a non-transitory computer-readable recording medium storing therein an encoding program that causes a computer to execute a process including: encoding, within compression target data, each part with a sequence of a same value into a count of consecutive runs of the value; decomposing the count of consecutive runs of the value into an addition of integers belonging to a predetermined integer group; calculating a probability of occurrence of each of the integers obtained by the decomposing; and encoding each of the integers by assigning a shorter code to an integer with a higher probability of occurrence.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIG. 9 illustrates an example of bit strings to be encoded with RLE;

FIG. 10 illustrates an example of a relationship between symbols and bit strings;

FIG. 11 illustrates an example of a relationship between encoding unit bit strings and symbol strings;

FIG. 15 illustrates an example of an uncompressed bitmap;

FIG. 17 illustrates an example of the index after RLE;

FIG. 20 illustrates a first example of compressed codes corresponding to the symbols;

FIG. 22 illustrates a second example of the compressed codes corresponding to the symbols;

FIG. 23 illustrates an example of the index in a compression format;

FIG. 26 illustrates an example of compression results of Region A;
FIG. 27 illustrates an example of compression results of Region B;
FIG. 28 illustrates an example of compression results of Region C;
FIG. 29 illustrates an example of compression results of Region D;
FIG. 30 illustrates an example of compression results of Region E;
FIG. 31 illustrates an example of compression results of Region F;
FIG. 32 illustrates an example of compression results of Region G;
and
FIG. 33 illustrates an example of compression results of Region H.

DESCRIPTION OF EMBODIMENTS

Figure 1:
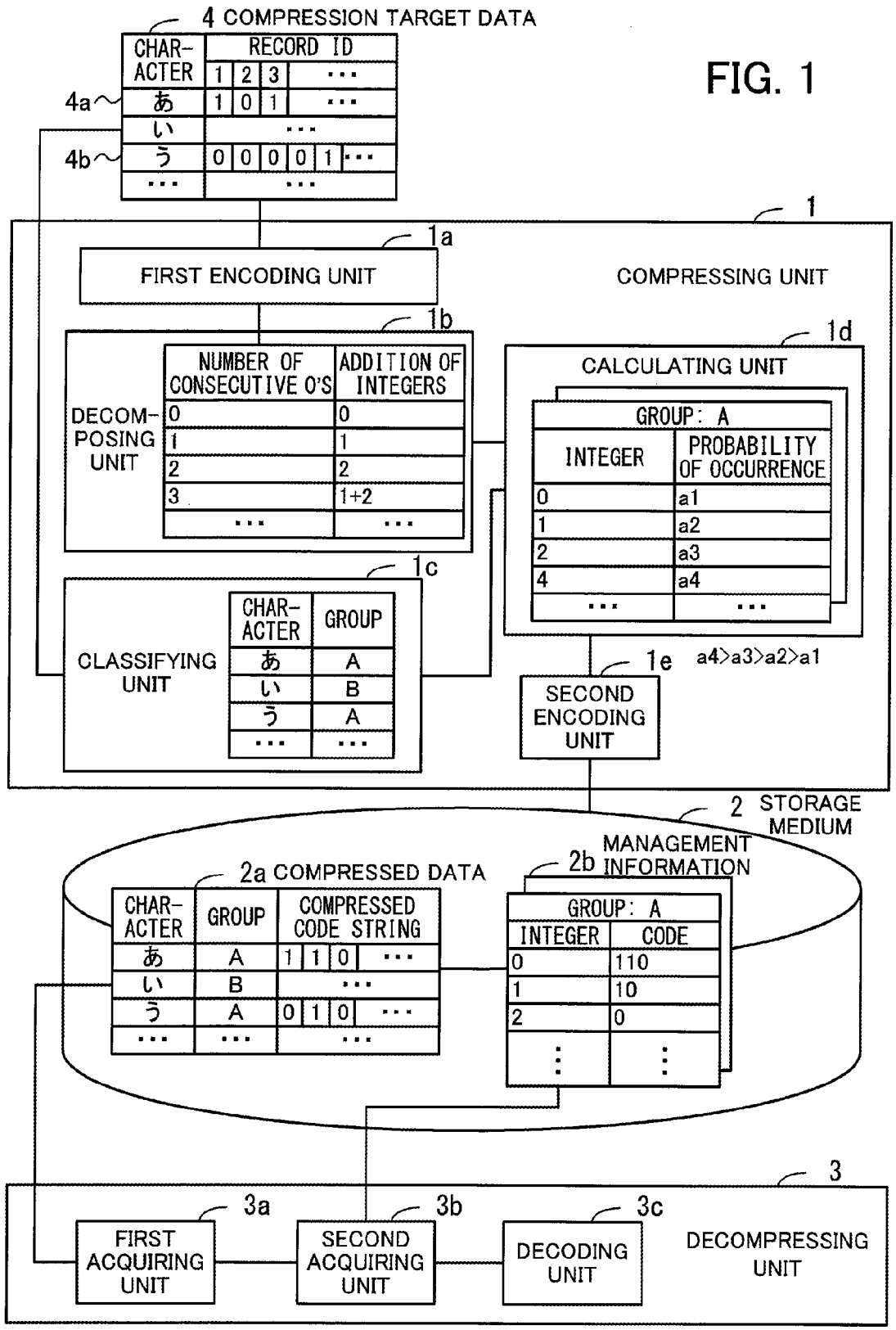
FIG. 1 illustrates an example of a functional configuration of an apparatus according to a first embodiment.

Several embodiments will be described below with reference to the accompanying drawings, wherein like reference numerals refer to like elements throughout. Note that two or more of the embodiments below may be combined for implementation in such a way that no contradiction arises.

First Embodiment

A first embodiment is described next. The first embodiment is directed to decomposing the number of consecutive runs of the same value into an addition of integers belonging to a predetermined integer group and encoding the integers by assigning shorter codes to integers with higher probabilities of occurrence. Such a coding system allows the probability of occurrence of the integers to be higher than the probability of occurrence of consecutive run counts of the same value, which increases the proportion of short codes to be assigned. Consequently, the compressibility is improved.

FIG. 1 illustrates an example of a functional configuration of an apparatus according to the first embodiment. The apparatus of the first embodiment includes a compressing unit 1, a storage medium 2, and a decompressing unit 3.

The compressing unit 1 compresses compression target data 4. The storage medium 2 is a computer-readable storage medium storing compressed data 2a generated by compressing the compression target data 4. The decompressing unit 3 decompresses the compressed data 2a. The compression target data 4 is, for example, a bitmap with a set of bit strings, each indicating whether a corresponding one of a plurality of characters is present or absent in each of a plurality of records including character strings.

The compressing unit 1 includes a first encoding unit 1a, a decomposing unit 1b, a classifying unit 1c, a calculating unit 1d, and a second encoding unit 1e.

The first encoding unit 1a encodes, within the compression target data 4, each part with a sequence of the same value into the number of consecutive runs of the value. Such encoding is referred to as RLE (run length encoding). In the case where the compression target data 4 is a bitmap including bit strings of, for example, 0's and 1's and the probability of occurrence of 0 is substantially higher than that of 1, the number of consecutive 0's is encoded. In this regard, in the case where the first bit of a bit string is 1, the number of consecutive 0's is encoded as zero.

The decomposing unit 1b decomposes the number of consecutive runs of the same value into an addition of integers belonging to a predetermined integer group. For example, the number of consecutive runs of the same value is decomposed into an addition of 0 and powers of 2. In that case, when the number of consecutive 0's is 0, 1, or 2, no more decomposition is possible and the value is used directly. When the number of consecutive 0's is 3, it is decomposed into '1+2'.

The classifying unit 1c classifies characters in the case where the compression target data 4 is a set of bit strings each indicating the presence and absence of a corresponding one of the characters. For example, the classifying unit 1c classifies each of the characters into one of a plurality of groups according to the proportion of bit values indicating the presence of the character in a corresponding bit string. Assume that, when a character is present in a record, a bit corresponding to the record within a bit string of the character is set to 1. In this case, the classifying unit 1c classifies each character according to the proportion of bits set to 1 to the entire bits of the bit string.

The calculating unit 1d calculates the probability of occurrence of each integer obtained by the decomposition. In the case where the characters are classified into a plurality of groups, the calculating unit 1d carries out this calculation with respect to each of the classification groups. More specifically, the probability of occurrence of each integer of the predetermined integer group is calculated based on bit strings individually corresponding to characters belonging to the classification group.

The second encoding unit 1e encodes each integer by assigning shorter codes to integers with higher probabilities of occurrence. Such a coding technique is called, for example, entropy coding. For example, using Huffman coding, the second encoding unit 1e encodes the bit strings of the compression target data 4 into Huffman codes.

In the case where the characters are classified into a plurality of groups, the second encoding unit 1e may perform encoding for each of the classification groups. For example, the second encoding unit 1e encodes individual integers obtained from bit strings corresponding to characters belonging to each classification group, based on the probabilities of occurrence calculated for the classification group.

The second encoding unit 1e stores, in the storage medium 2, for example, a set of coded arrays for the individual characters (compressed code strings), generated by the encoding, as the compressed data 2a. Note that the compressed data 2a includes, for example, the characters each in association with a classification group to which the character belongs and its compressed code string.

In addition, the second encoding unit 1e may store, in the storage medium 2, management information 2b which is information indicating correspondence between integers and codes. The correspondence between integers and codes is expressed, for example, in a coding tree such as a Huffman tree. In the case where the encoding has been performed for each classification group, the second encoding unit 1e may store, in the storage medium 2, the management information 2b which indicates the correspondence between integers and codes for each classification group.

The storage medium 2 stores therein, for example, the compressed data 2a obtained by compressing the compression target data 4. The compressed data 2a includes codes each corresponding to one of the integers belonging to the predetermined integer group. In addition, the storage medium 2 may store therein the management information 2b.

The decompressing unit 3 includes a first acquiring unit 3a, a second acquiring unit 3b, and a decoding unit 3c.

The first acquiring unit 3a acquires compressed code strings obtained by encoding the compression target data 4. For example, when a search string is input, the first acquiring unit 3a acquires, from the compressed data 2a stored in the storage medium 2, compressed code strings corresponding to individual characters included in the search string.

The second acquiring unit 3b acquires the management information 2b indicating the correspondence between the integers belonging to the integer group and the codes. For example, the second acquiring unit 3b reads the management information 2b from the storage medium 2. In the case where the first acquiring unit 3a has acquired compressed code strings of the characters included in the search string, the second acquiring unit 3b acquires, from the management information 2b, integer-to-code correspondence information associated with a classification group to which each character of the search string belongs.

The decoding unit 3c decodes codes in the acquired compressed code strings based on the acquired management information 2b. For example, the decoding unit 3c reads the acquired compressed code strings sequentially from the beginning. Next, the decoding unit 3c searches the acquired management information 2b for a code corresponding to a value in each of the read compressed code strings. When a corresponding code is found, the decoding unit 3c converts the beginning part of the compressed code string, which part matches the found code, into a sequence of the same value repeated as many times as indicated by an integer corresponding to the code. The decoding unit 3c performs such conversion over the entire acquired compressed code strings. Herewith, the compressed code strings are decoded.

In the system described above, in the case where, for example, the compression target data 4 is a set of bit strings each corresponding to a character, the first encoding unit 1a encodes each of the bit strings into the number of consecutive runs of the bit value '0'. Then, the decomposing unit 1b decomposes the number of consecutive 0's into an addition of integers belonging to an integer group. For example, when the integer group includes 0 and powers of 2, the number of consecutive 0's is decomposed into an addition of integers selected from the integer group composed of 0, 1, 2, 4, 8, and so on.

In addition, the characters may be classified into a plurality of groups by the classifying unit 1c. As for the classification of the characters, if the proportion of records including a hiragana character (Japanese phonetic character) 4a and the proportion of records including a hiragana character 4b are close to each other, the characters 4a and 4b are classified into the same group, Group A, for example.

Subsequently, the probability of occurrence of each integer is calculated by the calculating unit 1d. According to the example of FIG. 1, as for characters belonging to Group A, the probability of occurrence of an integer of 0 is a1, the probability of occurrence of an integer of 1 is a2, the probability of occurrence of an integer of 2 is a3, and the probability of occurrence of an integer 4 is a4. Assume here that the magnitude relation among the probabilities of occurrence is a4>a3>a2>a1.

The second encoding unit 1e encodes bit strings in the compression target data 4 by assigning shorter codes to integers with higher probabilities of occurrence. According to the example of FIG. 1, as for Group A, the code of the integer of 0 is '110' (code length: 3), the code of the integer of 1 is '10' (code length: 2), and the code of the integer of 2 is '0' (code length: 1). In this case, the first bit '1' of the character 4a is converted into the code '110'. In addition, the beginning part '0000' of the bit string of the character 4b is converted into the code '0'.

The compressed data 2a and the management information 2b generated by the compressing unit 1 are stored in the storage medium 2. Then, for example, when a search string is input to the decompressing unit 3, the first acquiring unit 3a extracts, from the compressed data 2a, compressed code strings corresponding to characters included in the search string. In addition, the second acquiring unit 3b acquires management information corresponding to classification groups to which the individual characters belong. Then, the decoding unit 3c decodes the extracted compressed code strings. According to the example of FIG. 1, as for the compressed code string of the character 4a belonging to Group A, the compressed code '110' at the beginning is decoded into a bit string '1'. In addition, as for the compressed code string of the character 4b belonging to Group A, the compressed code '0' at the beginning is decoded into a bit string '0000'.

In the above-described manner, the compression target data 4 is compressed and decompressed. According to the example of FIG. 1, the integer of 2 represents the bit string '0000' which is encoded into the 1-bit length code. Therefore, the bit string is compressed by encoding. On the other hand, as for the integer of 0, the bit string '1' is encoded into the code '110', and thus the code has a longer bit length than the original bit string. Note however that this has little adverse effect on the entire compressibility of the compressed data 2a because the integer of 0 has a lower probability of occurrence compared to other integers. As a result, it is possible to obtain the compressed data 2a with less amount of data than the compression target data 4.

Furthermore, according to the first embodiment, the number of consecutive runs of the same value is decomposed into an addition of integers. As a result, the probability of occurrence of integers belonging to the integer group becomes higher than the probability of occurrence of consecutive run counts of the same value. According to a coding system assigning shorter codes to symbols with higher probabilities of occurrence, such as Huffman coding, high compressibility is achieved when there are large deviations in values to be encoded. Hence, the compressibility is improved by decomposing the number of consecutive runs of the same value into an addition of integers of the integer group and assigning codes to the integers.

In addition, such a compression process is particularly effective in compression of a bitmap with a large deviation in the occurrence rates between 0 and 1. Assume the case of speeding up dictionary search using an index. Prior to the dictionary search, dictionary data is divided into a plurality of records, each of which is then compressed and stored. When a search string is input, records with characters included in the search string are determined using the index, and the determined records are decompressed. In this regard, if the dictionary data has been very finely divided so that each record is small in size, the processing amount at the time of decompressing the records is reduced. On the other hand, an enormous number of records are created by finely dividing the dictionary data. In such a case, when the compression target data 4 is created, the values of bits each corresponding to a different one of the records are predominantly 0's because the size of each recode is small. Especially in the case of Japanese language, there are a lot of infrequently used kanji characters, and the bit strings of such kanji characters would hardly include 1's. Therefore, long runs of consecutive 0's frequently appear in the created compression target data 4. As a result, compressing the compression target data 4 using the technique according to the first embodiment achieves high compressibility.

Furthermore, each character is classified into one of a plurality of groups according to the proportion of the bit value indicating the presence of the character in a corresponding bit string, which enables the bit string of each character to be compressed into appropriate codes according to the proportion of the bit value indicating the presence of the character. This further improves the compressibility.

The compressing unit 1 and the decompressing unit 3 may be implemented by a central processing unit (CPU) of the information processing apparatus. In addition, the storage medium 2 may be implemented by a portable storage medium, such as an optical disk, random access memory (RAM) of the information processing apparatus, or a hard disk drive (HDD).

In FIG. 1, each line connecting the individual components represents a part of communication paths, and communication paths other than those illustrated in FIG. 1 are also configurable.

Second Embodiment

A second embodiment is described next. The second embodiment is directed to compressing an index of dictionary data. The following gives a detailed description of the second embodiment.

Figure 2:
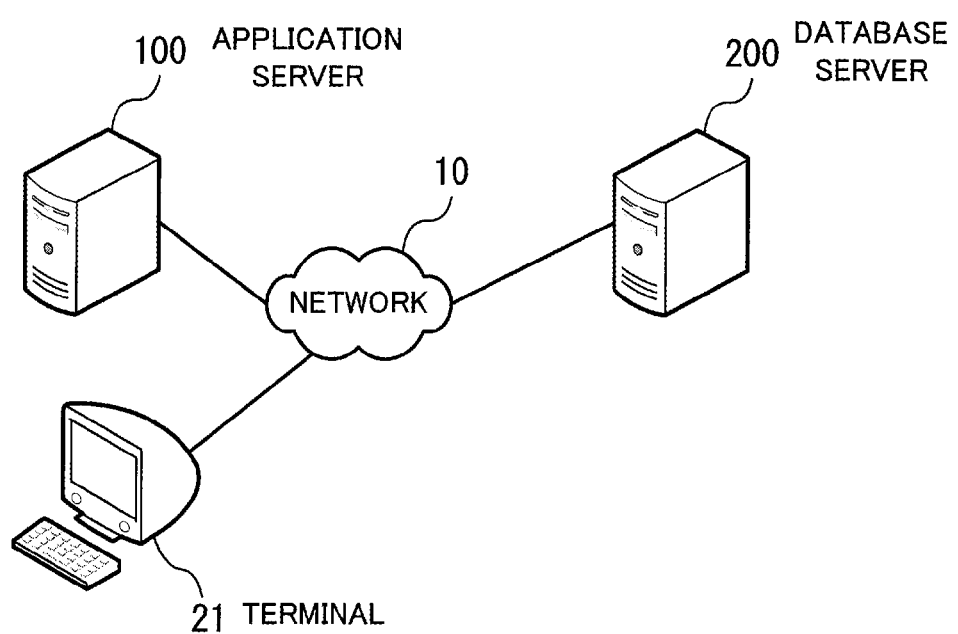
FIG. 2 illustrates an example of a system configuration according to a second embodiment.

FIG. 2 illustrates an example of a system configuration according to the second embodiment. In the second embodiment, for example, an application server 100, a database server 200, and a terminal 21 are connected to each other via a network 10. The database server 200 includes a database storing therein information such as dictionary data. The application server 100 searches information stored in the database server 200 in response to a request from the terminal 21, and transmits search results to the terminal 21. The terminal 21 transmits such a search request to the application server 100 in response to a user's operation, and displays the search results sent from the application server 100 on a monitor.

Figure 3:
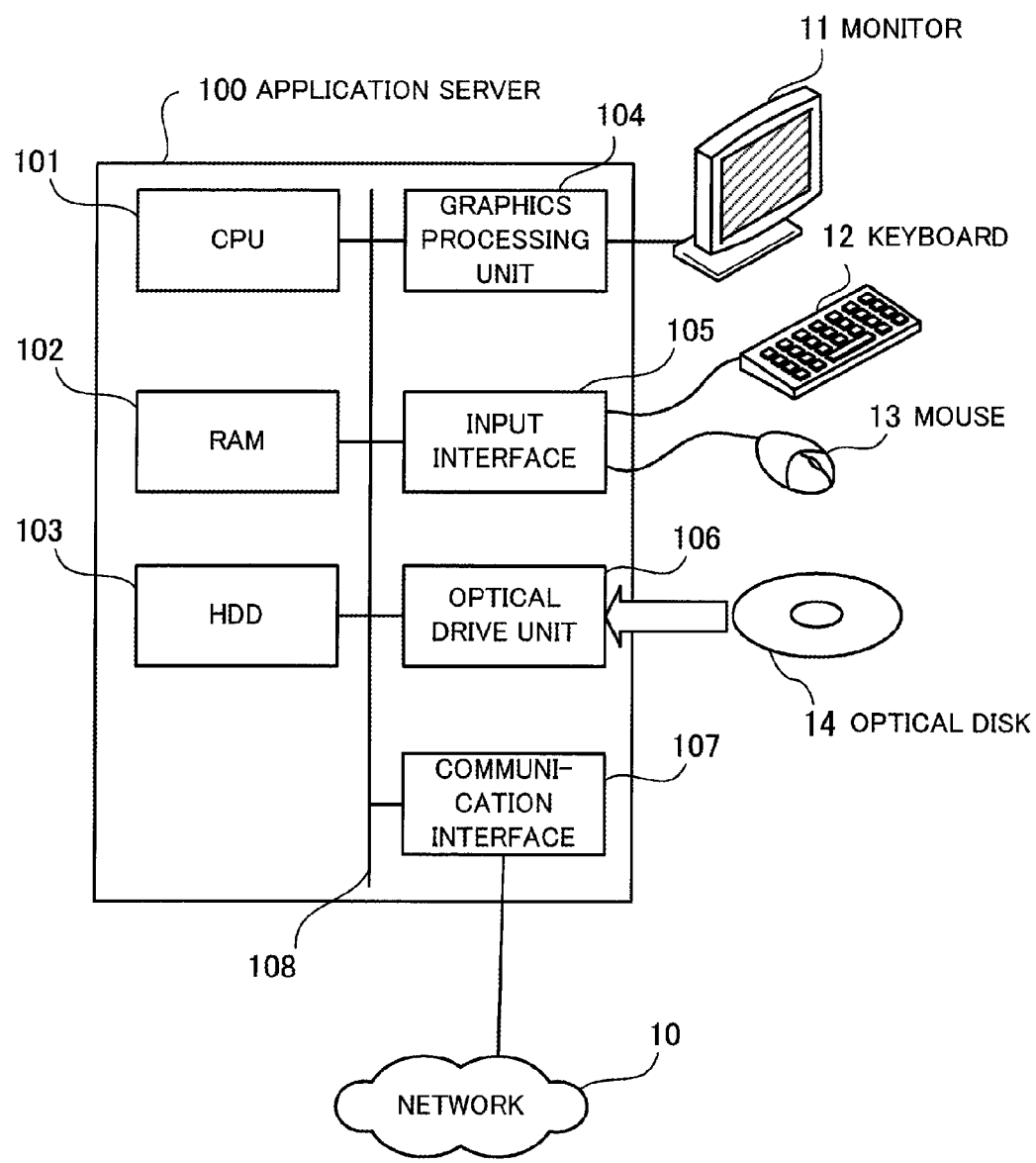
FIG. 3 illustrates an example of a hardware configuration of an application server used in the second embodiment.

FIG. 3 illustrates an example of a hardware configuration of an application server used in the second embodiment. Overall control of the application server 100 is exercised by a CPU 101. To the CPU 101, RAM 102 and a plurality of peripherals are connected via a bus 108. Note that the number of CPUs in the application server 100 is not limited to one, and two or more CPUs may be provided instead. In the case where the application server 100 has a plurality of CPUs, the CPUs exercise overall control of the application server 100 in cooperation with one another.

The RAM 102 is used as a main storage device of the application server 100. The RAM 102 temporarily stores at least part of an operating system (OS) program and application programs to be executed by the CPU 101. The RAM 102 also stores therein various types of data to be used by the CPU 101 for its processing.

The peripherals connected to the bus 108 include a HDD 103, a graphics processing unit 104, an input interface 105, an optical drive unit 106, and a communication interface 107.

The HDD 103 magnetically writes and reads data to and from a built-in disk, and is used as a secondary storage device of the application server 100. The HDD 103 stores therein the OS program, application programs, and various types of data. Note that a semiconductor storage device such as a flash memory may be used as a secondary storage device in place of the HDD 103.

To the graphics processing unit 104, a monitor 11 is connected. According to an instruction from the CPU 101, the graphics processing unit 104 displays an image on a screen of the monitor 11. A cathode ray tube (CRT) display or a liquid crystal display may be used as the monitor 11.

To the input interface 105, a keyboard 12 and a mouse 13 are connected. The input interface 105 transmits signals sent from the keyboard 12 and the mouse 13 to the CPU 101. Note that the mouse 13 is just an example of pointing devices, and a different pointing device such as a touch panel, a tablet, a touch-pad, and a track ball, may be used instead.

The optical drive unit 106 reads data recorded on an optical disk 14 using, for example, laser light. The optical disk 14 is a portable storage medium on which data is recorded to be read by reflection of light. Examples of the optical disk 14 include a digital versatile disc (DVD), a DVD-RAM, a compact disk read only memory (CD-ROM), a CD recordable (CD-R), and a CD-rewritable (CD-RW).

The communication interface 107 is connected to the network 10. Via the network 10, the communication interface 107 transmits and receives data to and from different computers and communication devices.

The hardware configuration described above achieves the processing functions of the second embodiment. Note that FIG. 3 illustrates the hardware configuration of the application server 100, however, each of the database server 200 and the terminal 21 may be built with the same hardware configuration. In addition, the information processing apparatus of the first embodiment may be built with the same hardware configuration as the application server 100 of FIG. 3.

Figure 4:
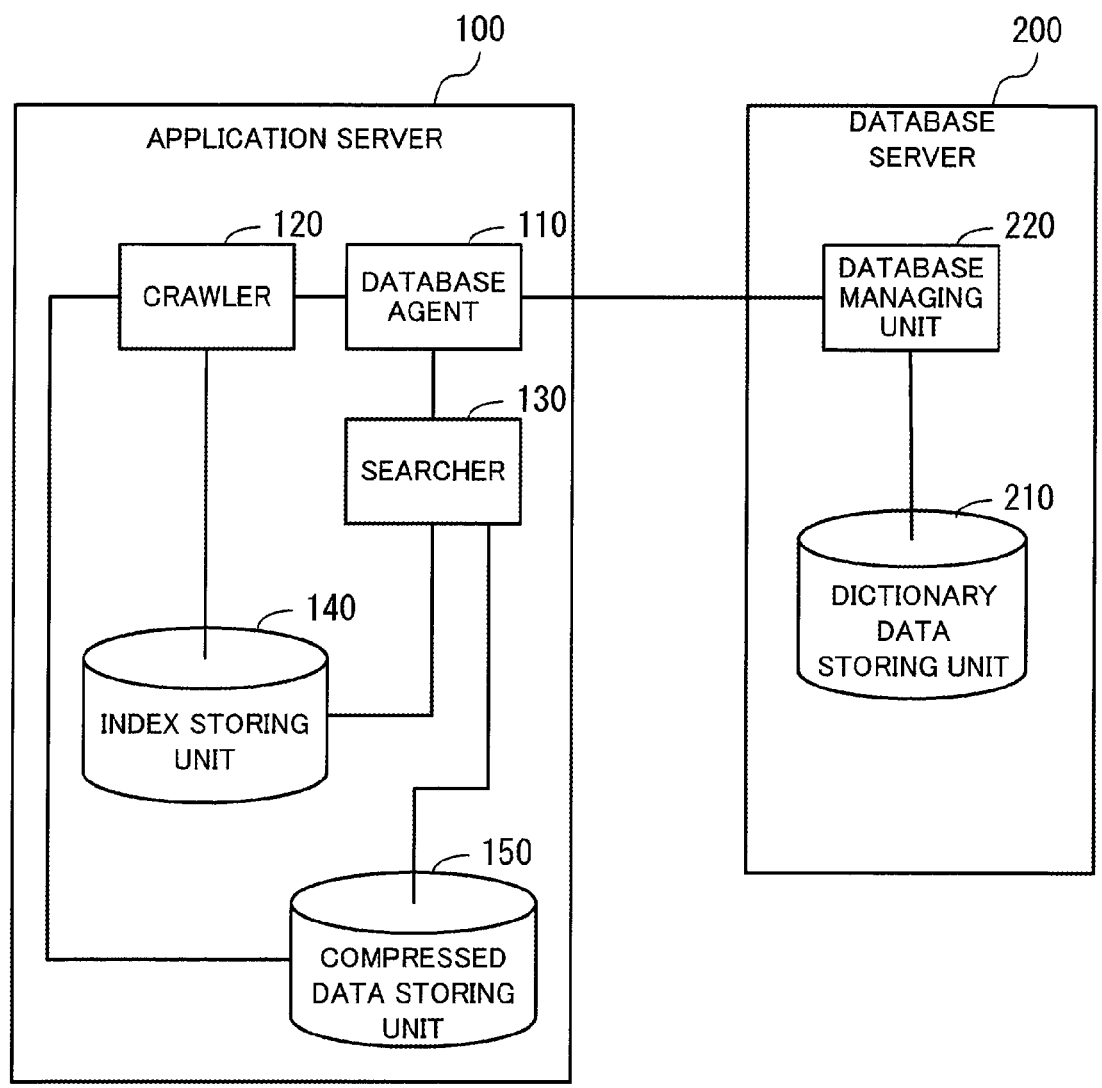
FIG. 4 is a block diagram illustrating an example of functions of each apparatus according to the second embodiment.

FIG. 4 is a block diagram illustrating an example of functions of each apparatus according to the second embodiment. The database server 200 includes a dictionary data storing unit 210 and a database managing unit 220.

The dictionary data storing unit 210 stores therein data of dictionaries, such as a Japanese-language dictionary, an English-Japanese dictionary, and a Japanese-English dictionary. For example, a part of the storage area of a HDD of the database server 200 is used as the dictionary data storing unit 210. Note that the dictionary data includes a plurality of records. For example, the records of the dictionary data individually correspond to dictionary entries.

The database managing unit 220 manages the data stored in the dictionary data storing unit 210. For example, the database managing unit 220 reads data from the dictionary data storing unit 210 in response to a request from the application server 100, and transmits the read data to the application server 100.

The application server 100 includes a database agent 110, a crawler 120, a searcher 130, an index storing unit 140, and a compressed data storing unit 150.

The database agent 110 sends an operation request to the database server 200 for an operation to the dictionary data storing unit 210. For example, in response to a request from the crawler 120 or the searcher 130, the database agent 110 transmits, to the database server 200, a request to acquire records from the dictionary data storing unit 210. In this case, the database agent 110 transmits records returned in response from the database server 200 to the crawler 120 or the searcher 130.

The crawler 120 acquires records from the database server 200 via the database agent 110, and creates an index of the records stored in the dictionary data storing unit 210. The created index is information in bitmap format, indicating the presence and absence of individual characters of various types in each of a plurality of records stored in the dictionary data storing unit 210. The crawler 120 stores the created index in the index storing unit 140.

In addition, the crawler 120 compresses the acquired records and stores the compressed records in the compressed data storing unit 150. Herewith, archives of dictionary data are established in the compressed data storing unit 150.

In response to a search request from the terminal 21, the searcher 130 searches data in the dictionary data storing unit 210. For example, upon receiving a search request from the terminal 21, the searcher 130 determines records in which each character included in a character string indicated in the search request appears at least once, based on the index stored in the index storing unit 140. Next, the searcher 130 acquires the determined records from the database server 200 via the database agent 110, and then stores the acquired records in the compressed data storing unit 150. Subsequently, the searcher 130 searches the records stored in the compressed data storing unit 150 for the character string indicated in the search request, and transmits a list of records including the character string to the terminal 21 as a search result.

In the index storing unit 140, the index created based on records stored in the dictionary data storing unit 210 is stored by the crawler 120. For example, a part of the storage area of the HDD 103 is used as the index storing unit 140.

In the compressed data storing unit 150, the records acquired and compressed by the crawler 120 is stored. For example, a part of the storage area of the HDD 103 is used as the compressed data storing unit 150.

The system having the above-described configuration creates the index in bitmap format and carries out information search using the index.

Note that in FIG. 4, each line connecting the individual components represents a part of communication paths, and communication paths other than those illustrated in FIG. 4 are also configurable.

Next described in detail are the records stored in the dictionary data storing unit 210.

Figure 5:
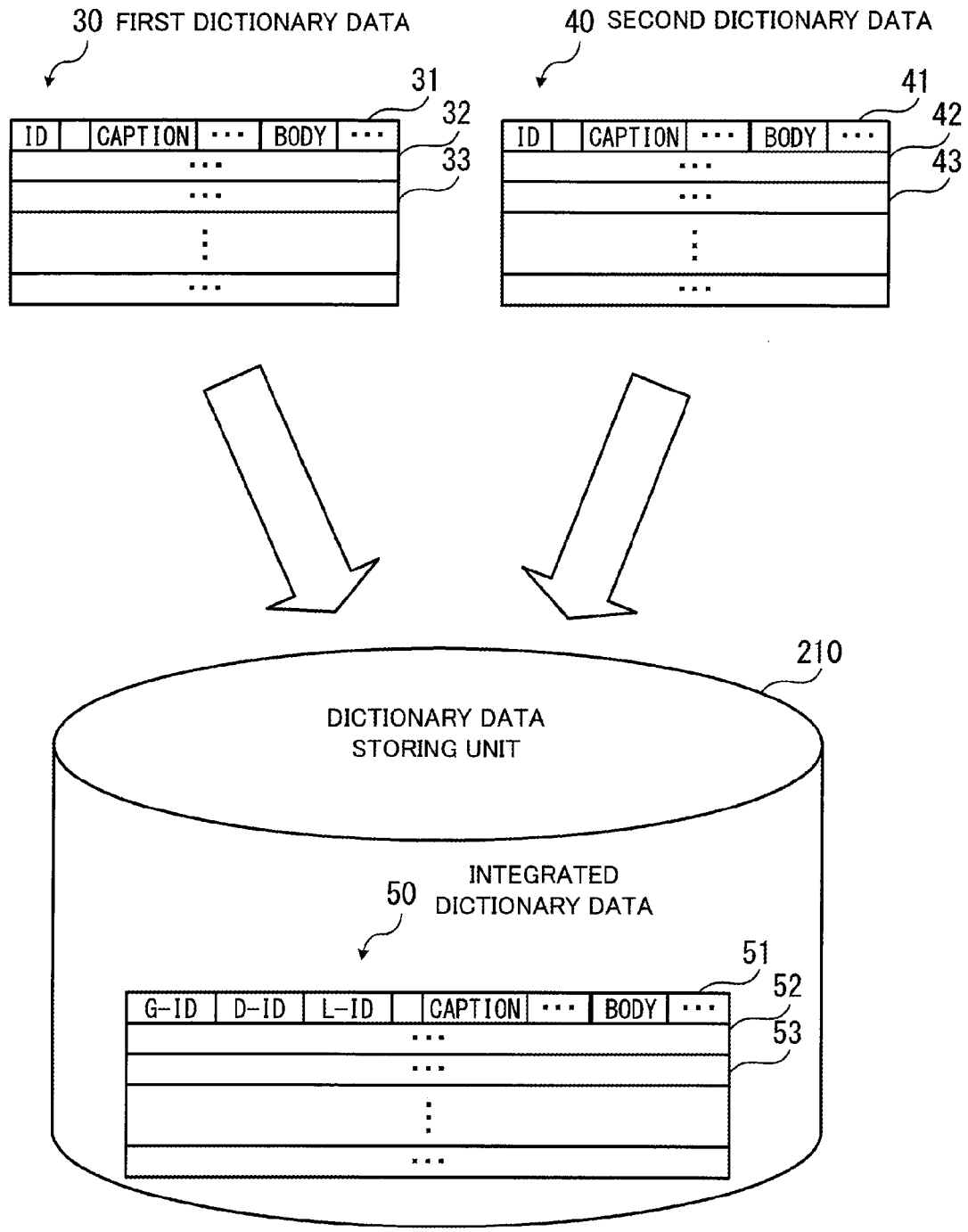
FIG. 5 illustrates an example of a data structure of a dictionary data storing unit.

FIG. 5 illustrates an example of a data structure of a dictionary data storing unit. According to an example of FIG. 5, the dictionary data storing unit 210 stores therein integrated dictionary data 50 created by integrating first dictionary data 30 and second dictionary data 40.

The first dictionary data 30 contains a plurality of records 31, 32, 33 and so on, corresponding to individual entries. Each of the records 31, 32, 33 and so on includes, for example, an identifier used to uniquely identify the record in the first dictionary data 30 (local identifier), a caption of the entry, and a body of the entry.

The second dictionary data 40 contains a plurality of records 41, 42, 43 and so on, corresponding to individual entries. Each of the records 41, 42, 43 and so on includes, for example, an identifier (ID) used to uniquely identify the record in the second dictionary data 40 (local identifier), a caption of the entry, and a body of the entry.

The integrated dictionary data 50 stored in the dictionary data storing unit 210 includes a plurality of records 51, 52, 53 and so on. The records 51, 52, 53 and so on are generated, for example, by copying the records 31, 32, 33 and so on of the first dictionary data 30 and the records 41, 42, 43 and so on of the second dictionary data 40 and changing their identifiers. Each of the records 51, 52, 53 and so on includes a global identifier (G-ID), a dictionary identifier (D-ID), a local identifier (L-ID), a caption of the entry, and a body of the entry. The global identifier is an identifier used to identify each record in the integrated dictionary data 50. The dictionary identifier is an identifier used to identify copy source dictionary data. The local identifier is an identifier of a copy source record in the copy source dictionary data.

In the case where the integrated dictionary data 50 is created from the first dictionary data 30 and the second dictionary data 40, the global identifier and the dictionary identifier are assigned to each record copied from the first dictionary data 30 and the second dictionary data 40. As for the global identifiers, for example, sequential numbers are used. Note that the creation of the integrated dictionary data 50 is carried out, for example, by the database managing unit 220. Alternatively, the integrated dictionary data 50 created by a different computer may be stored in the database server 200.

Next described is a process of compressing each record in the integrated dictionary data 50 and creating an index. The crawler 120 carries out the record compression and index creation process.

Figure 6:
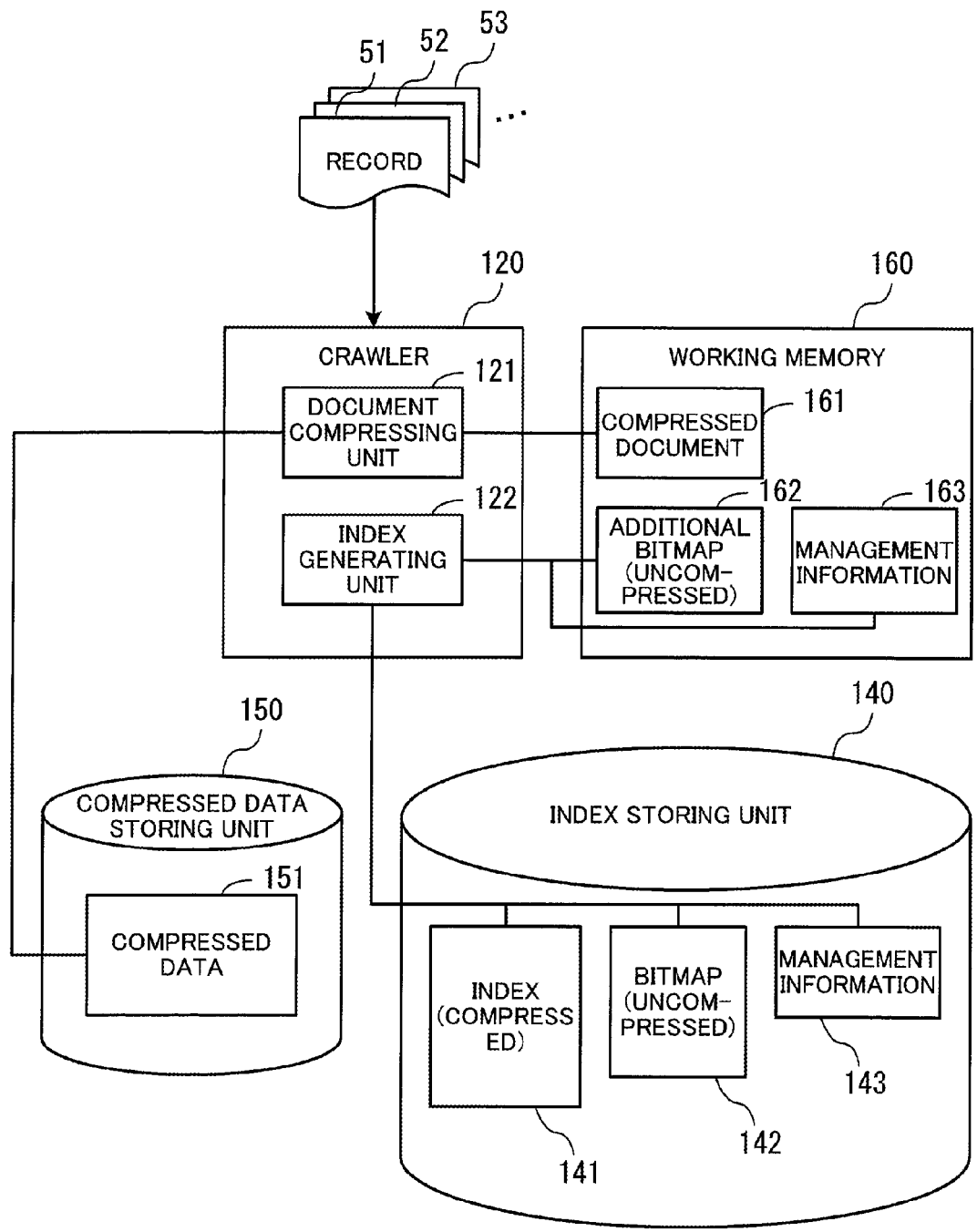
FIG. 6 illustrates an example of functions for record compression and index creation by a crawler.

FIG. 6 illustrates an example of functions for record compression and index creation by a crawler. Using working memory 160, the crawler 120 compresses the records 51, 52, 53, and so on and creates a bitmap indicating the presence and absence of individual characters in each of the records 51, 52, 53, and so on. In order to perform this process, the crawler 120 includes a document compressing unit 121 and an index generating unit 122. Note that a part of the storage area of the RAM 102, for example, is used as the working memory 160.

The document compressing unit 121 compresses the records 51, 52, 52 and so on acquired from the database server 200. For example, the document compressing unit 121 is able to combine various coding systems, such as Huffman coding and a sliding dictionary method, to thereby compress the records 51, 52, 52 and so on. The document compressing unit 121 sequentially encodes a character string in each of the records 51, 52, 53 and so on and then stores the compression result in the working memory 160. When all the character strings in the records 51, 52, 53 and so on are encoded, a compressed document 161 is generated in the working memory 160. Subsequently, the document compressing unit 121 adds the compressed document 161 to compressed data 151 in the compressed data storing unit 150.

The index generating unit 122 analyzes the records 51, 52, 53 and so on to determine, for example, whether each of all characters represented in predetermined character codes appears in the individual records 51, 52, 53 and so on. Each time determining the presence or absence of one character, the index generating unit 122 stores, in the working memory 160, a one-bit value indicating the presence or absence of the character. Once the presence or absence is determined for each of all the characters represented in predetermined character codes, an additional bitmap 162 is generated in the working memory 160. At this stage, the additional bitmap 162 is uncompressed.

The index generating unit 122 stores the generated additional bitmap 162 in the index storing unit 140. Next, the index generating unit 122 compresses an additional bitmap 142 stored in the index storing unit 140 and then adds the compressed bitmap to an index 141 in the index storing unit 140.

In addition, the index generating unit 122 generates management information 163 related to the additional bitmap 162 and stores the management information 163 in the working memory 160. The management information 163 stores therein various types of information to be used in a search process using the index 141. For example, according to the second embodiment, in order to compress the bitmap 142, the index generating unit 122 first divides a numerical range from 0 to 1, used to indicate the frequency of occurrence of each character, into a plurality of regions. Then, according to the frequency of occurrence of each character in individual records, the index generating unit 122 determines which region the character belongs to. Then, the index generating unit 122 stores, in the management information 163, for example, the frequency of occurrence of each character or information of the region to which each character belong. Herewith, when the index 141 is decompressed, the region of each character is determined based on the management information 163. The index generating unit 122 stores, in the index storing unit 140, the management information 163 generated in the working memory 160. Herewith, the management information 143 is stored in the index storing unit 140.

Next described is the uncompressed bitmap 142 created based on the integrated dictionary data 50.

Figure 7:
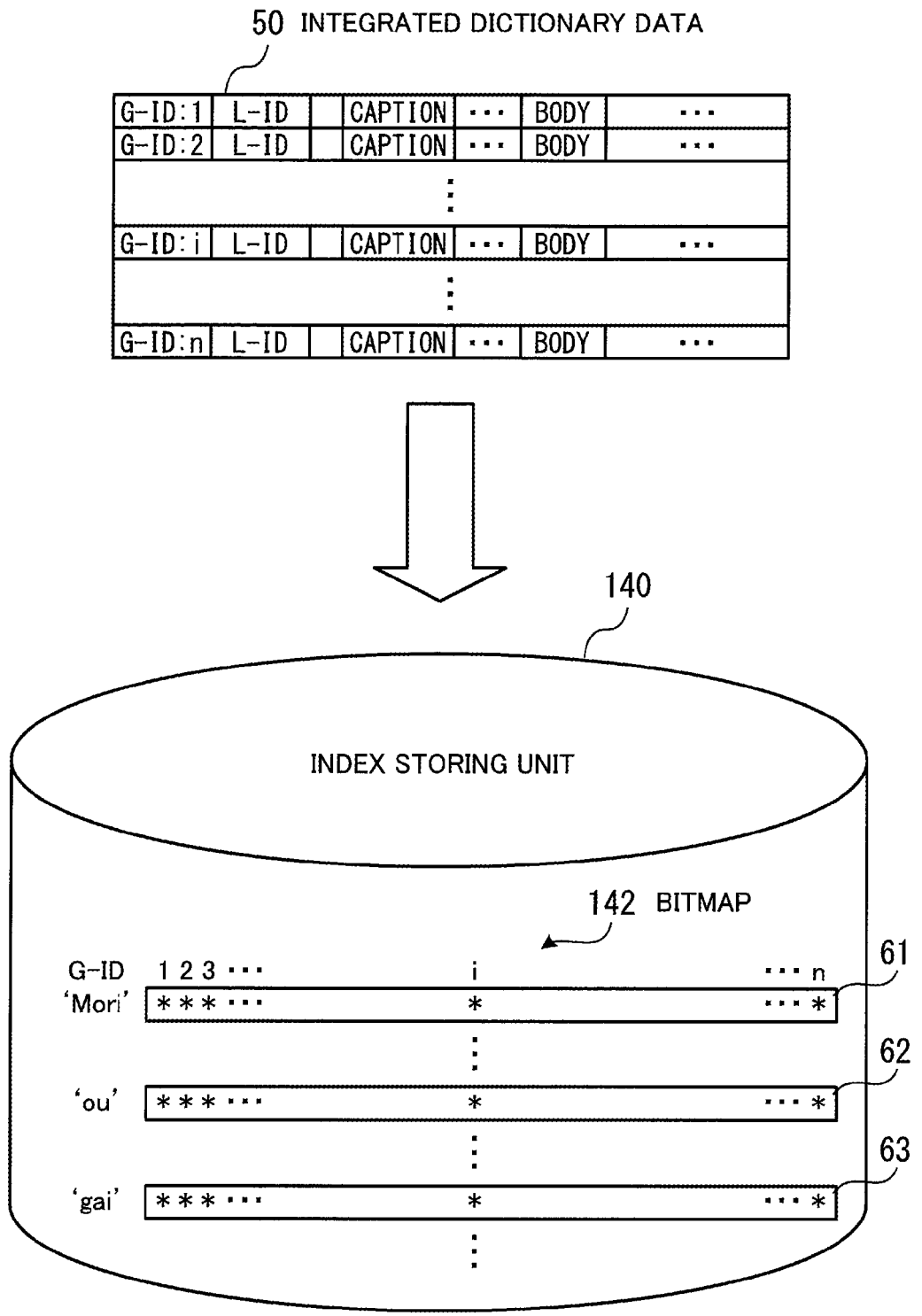
FIG. 7 illustrates an example of a data structure of a bitmap.

FIG. 7 illustrates an example of a data structure of a bitmap. The uncompressed bitmap 142 is stored in the index storing unit 140, and is a set of bit strings 61, 62, 63 and so on individually corresponding to different characters. Each of the bit strings 61, 62, and so on is a bit array with as many bits as the number of records of the integrated dictionary data 50. For example, when the integrated dictionary data 50 contains n records (n is an integer equal to or more than 1), each bit string is n bits long.

According to the example of FIG. 7, individual bits in each of the bit strings 61, 62, 63 and so on are associated with global identifiers sequentially in ascending order, starting with 1 from the left. For example, the leftmost bit is associated with Global Identifier 1 and the rightmost bit is associated with Global Identifier n.

Each bit in the individual bit strings 61, 62, 63 and so on indicates whether a character corresponding to the bit string appears at least once in a record indicated by a corresponding global identifier in the integrated dictionary data 50. For example, if the character corresponding to the bit string appears in a record at least once, a bit corresponding to the global identifier of the record is set to 1. On the other hand, if the character corresponding to the bit string does not appear in a record at all, a bit corresponding to the global identifier of the record is set to 0.

The bitmap 142 with such a configuration is compressed to thereby generate the index 141. To compress the bitmap 142, first, RLE is applied to the bit strings 61, 62, 63 and so on included in the bitmap 142.

Here is described RLE applied to character strings. RLE represents runs of the same data value by a single data value and the length of the runs. For example, a character string 'AAAAABBBBBBBBBAAA' is represented by 'A5B9A3' which indicates five runs of A, which is followed by nine runs of B, which is then followed by three runs of A. Note that the number of runs may come before a symbol indicating the original data. In this case, the above character string is encoded as '5A9B3A'.

Further, the above string is represented simply by '593' if it has been arranged that the data includes only the two data values (A and B) and always starts with A. In this case, if data starts with B, it is considered that the data starts with a zero run of A. For example, a character string 'BBBAAAAABBBBBAAA' is represented by '03553'.

The bitmap 142 indicating the presence and absence of individual characters in each record is data representing whether individual characters and basic words are included in each target file or record in the form of 1's (ON) and 0's (OFF). The source of the bitmap 142 is a zero-memory source. Note that a zero-memory source is a source in which each data piece does not depend on others and is independent of the context.

To take a Japanese-language dictionary as an example, in the case where about twenty to thirty entries are stored in one file, the average frequency of occurrence of a kanji character is 1 in 13 characters, and it is often the case that 0 is repeated consecutively while 1 appears alone, as described below. In view of this, according to the second embodiment, the bit strings in the bitmap 142 are decomposed into bit strings each composed of consecutive 0's and a single 1 (referred to as 'encoding unit bit strings'), and then RLE is applied to each of the encoding unit bit strings obtained by the decomposing. Herewith, compression with shorter codes is achieved.

Figure 8:
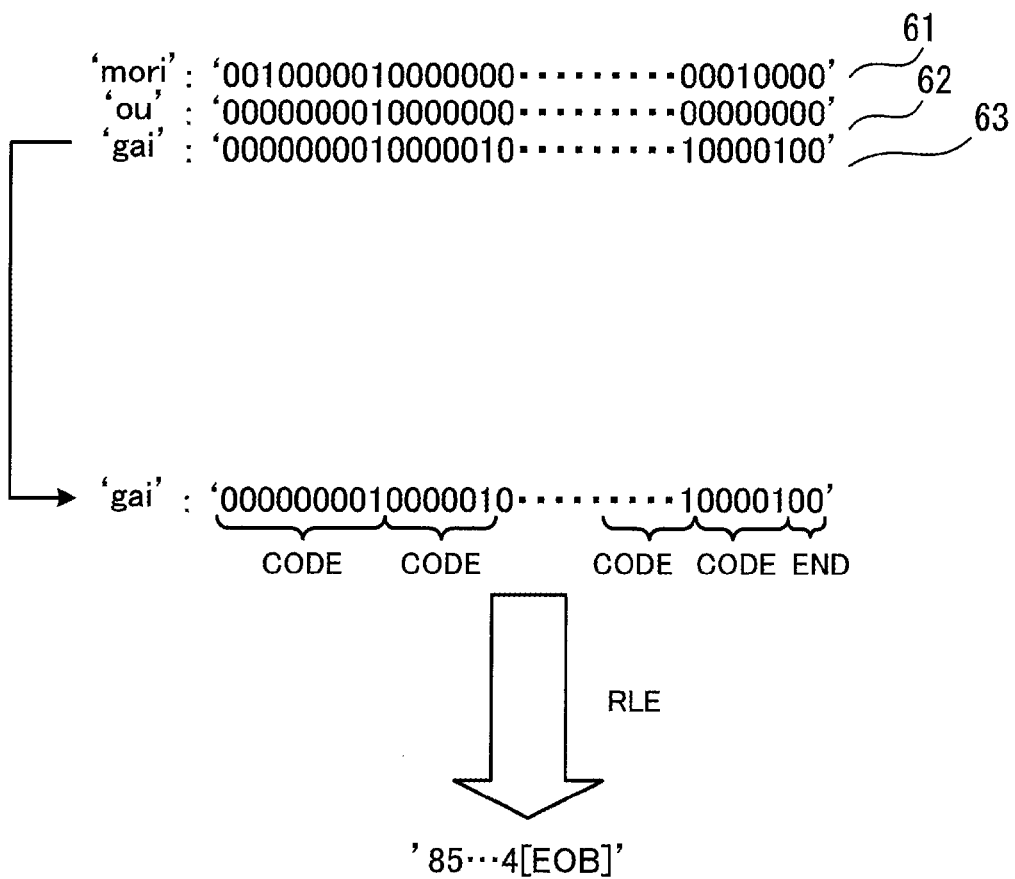
FIG. 8 illustrates an example of applying RLE to a bit string.

FIG. 8 illustrates an example of applying RLE to a bit string. FIG. 8 depicts an example of the bit strings 61, 62, and 63 of individual characters making up a character string of 'mori', 'ou', 'gai'. As illustrated in FIG. 8, in each of the bit strings 61, 62, and 63, the value of a bit is set to 1 if a corresponding character appears in a record corresponding to a bit location of the bit, and the value of a bit is set to 0 if the corresponding character does not appear in the record.

RLE is applied to such bit strings 61, 62, 63. For example, the bit string 63 corresponding to 'gai' is '0000000010000010 . . . 10000100'. Note that the two 0's at the end is a symbol indicating the string end. In the bit string 63, eight consecutive 0's come first which are followed by a single 1, and then five consecutive 0's follow. At a part immediately before the end of the bit string 63, a single 1 is followed by four consecutive 0's, and then a single 1 follows. In this case, the bit string is compressed into codes '85 . . . 4[EOB]' ([EOB] is a symbol indicating a string end).

To further increase the compressibility, Huffman coding is applied to the run length codes obtained by compressing the bit strings 61, 62, 63 and so on. Note that Huffman coding is an example of coding techniques assigning shorter codes to symbols with higher probabilities of occurrence.

FIG. 9 illustrates an example of bit strings to be encoded with RLE. According to the example of FIG. 9, the number of consecutive 0's is referred to as the run length, and information including encoding unit bit string, probability of occurrence, bit length, and remaining probability is provided in association with each run length. The probability of occurrence indicates the probability of occurrence of an encoding unit bit string corresponding to the run length in the case where 0 and 1 appear randomly (i.e., 0 and 1 appear with the same probability). The bit length indicates the length of a code (bit number) generated by encoding a corresponding encoding unit bit string using a Huffman tree based on a corresponding probability of occurrence. The remaining probability indicates the probability of occurrence of encoding unit bit strings whose run lengths are longer than the associated run length. For example, because the probability of occurrence of the run length 0 is ½, the probability of occurrence of encoding unit bit strings longer than the run length 0 (i.e., the run lengths 1 and larger) is ½ (=1−½). Therefore, the remaining probability of the run length 0 is ½.

As illustrated in FIG. 9, when bit values appear randomly, encoding unit bit strings with shorter bit lengths have higher probabilities of occurrence. Huffman coding is a coding system assigning shorter codes to bit strings with higher probabilities of occurrence. Therefore, in the case where bit values appear randomly, short codes are assigned to bit strings originally having short bit lengths, and thus effective compression is not much expected.

On the other hand, effective compression is expected, for example, when the frequency of 0's or 1's is low. That is, if the probabilities of occurrence of encoding unit bit strings with long run lengths are higher than those of encoding unit bit strings with short run lengths, Huffman coding encodes the encoding unit bit strings with long run lengths into short codes. As a result, the entire compressibility increases.

In general, there are six to eight thousand characters in Japanese language. Amongst them, about one thousand characters including hiragana characters, katakana characters (another type of Japanese phonetic characters), alphanumeric characters, and the most commonly used kanji characters. A Japanese-language dictionary contains a large number of characters appearing only in one or two entries out of ten thousand entries. Therefore, there are as many as thousands of kinds of run lengths of the encoding unit bit strings. If a Huffman tree is generated directly based on the thousands of kinds of run lengths, the Huffman tree has thousands of leaves. As the number of leaves of the Huffman tree increases, the amount of calculation needed to generate the Huffman tree increases exponentially. Therefore, the implementation of such a Huffman tree generation process in a resource saving hardware environment with a low speed CPU and lower-capacity memory is extremely difficult.

In view of this problem, according to the second embodiment, the length of consecutive 0's (run length) is represented by a combination of integers included in a predetermined integer group. For example, each run length is represented by a combination of 0 and powers of an integer.

In the case of representing the length of consecutive 0's by an addition of powers of 2, the values of exponents are used as symbols corresponding to each run length. According to the second embodiment, consecutive 0's and a single 1 following the consecutive 0's are collectively treated as an encoding unit bit string. To encode such encoding unit bit strings, symbols used to represent '1' are prepared. For example, a symbol corresponding to 1 is α, and a symbol corresponding to '01' is β. The symbol 'α' indicates that the number of consecutive 0's is zero, and the symbol 'β' indicates that the number of consecutive 0's is one (=2 raised to the power of 0).

Each encoding unit bit string is decomposed into bit string patterns corresponding to integers belonging to an integer group. Next described is a relationship between symbols indicating integers belonging to the integer group and bit string patterns with reference to FIG. 10.

FIG. 10 illustrates an example of a relationship between symbols and bit strings. As illustrated in FIG. 10, the number of 0's indicated by the symbol 'α' is zero, and the symbol 'α' corresponds to a bit string pattern '1' in some encoding unit bit strings. In each of these encoding unit bit strings, the symbol 'α' indicates the end of the encoding unit bit string.

The number of 0's indicated by the symbol 'β' is one, and the symbol 'β' corresponds to a bit string pattern '01' in some encoding unit bit strings. In each of these encoding unit bit strings, the symbol 'β' indicates the end of the encoding unit bit string.

The number of 0's indicated by a symbol '1' is two, which is $2^1$ when expressed as a power of 2. The symbol '1' corresponds to a bit string pattern '00' within an encoding unit bit string, and does not come at the end of the encoding unit bit string. In FIG. 10, a symbol '+' indicating that a different bit string pattern follows is added after the bit string pattern '00'.

The number of 0's indicated by a symbol '2' is four, which is $2^2$ when expressed as a power of 2. The symbol '2' corresponds to a bit string pattern '0000' within an encoding unit bit string, and does not come at the end of the encoding unit bit string. In FIG. 10, the symbol '+' indicating that a different bit string pattern follows is added after the bit string pattern '0000'.

As for symbols after the symbol '2', in a similar fashion, the number of 0's in a bit string pattern doubles each time the symbol value is incremented by 1.

Defining the symbols as illustrated in FIG. 10 allows each encoding unit bit string to be decomposed into bit string patterns, which are represented by a combination of one or more of the symbols (a symbol string).

FIG. 11 illustrates an example of a relationship between encoding unit bit strings and symbol strings. In FIG. 11, information including encoding unit bit string, symbol string, probability of occurrence, bit length, and remaining probability is provided in association with each run length. Note that the probability of occurrence indicates the probability of appearance of a corresponding encoding unit bit string in the case where 0 and 1 appear randomly. The bit length indicates the bit length of a corresponding encoding unit bit string. The remaining probability indicates the probability of occurrence of encoding unit bit strings whose run lengths are longer than the associated run length.

An encoding unit bit string '1' with Run Length 0 corresponds to a symbol string 'α'. An encoding unit bit string '01' with Run Length 1 corresponds to a symbol string 'β'. An encoding unit bit string '001' with Run Length 2 corresponds to a symbol string '1α'. An encoding unit bit string '0001' with Run Length 3 corresponds to a symbol string '1β'. An encoding unit bit string '00001' with Run Length 4 corresponds to a symbol string '2α'. In a similar fashion, each of subsequent encoding unit bit strings is expressed by a symbol string formed by a combination of the symbols of FIG. 10 no matter how many consecutive 0's are included in the encoding unit bit string.

Converting encoding unit bit strings in a bitmap into corresponding symbol strings in this manner reduces the number of symbols used in RLE, which enables the implementation of such a bitmap in a resource saving hardware environment.

When the integrated dictionary data 50 contains about ten thousand records, for example, the bit string length for each character in a bitmap is also about 10 k bits. In this case, all the encoding unit bit strings are converted into symbol strings if symbols corresponding to up to Run Length 8192 have been prepared. Then, the encoding unit bit strings making up the about 10 k-bit bitmap are expressed by combinations of only 15 (=2+13) kinds of symbols.

In the case of further compressing, using Huffman coding, the symbol strings encoded using RLE, each symbol is assigned to a different leaf of a Huffman tree. The Huffman tree generated in this manner has only fifteen leaves, which is a drastic reduction from thousands of leaves in the case of assigning run lengths to the leaves of the Huffman tree. Thus, the size of the Huffman tree is reduced and less time is therefore needed to generate the Huffman tree.

The reduction in the size of the Huffman tree and, therefore, less time needed to generate the Huffman tree facilitates classifying characters according to the frequency of occurrence and generating the Huffman tree according to the frequency of occurrence. According to the second embodiment, for example, a range of values from 0 to 1 used to indicate the occurrence rate of each character is divided into ten regions.

Figure 12:
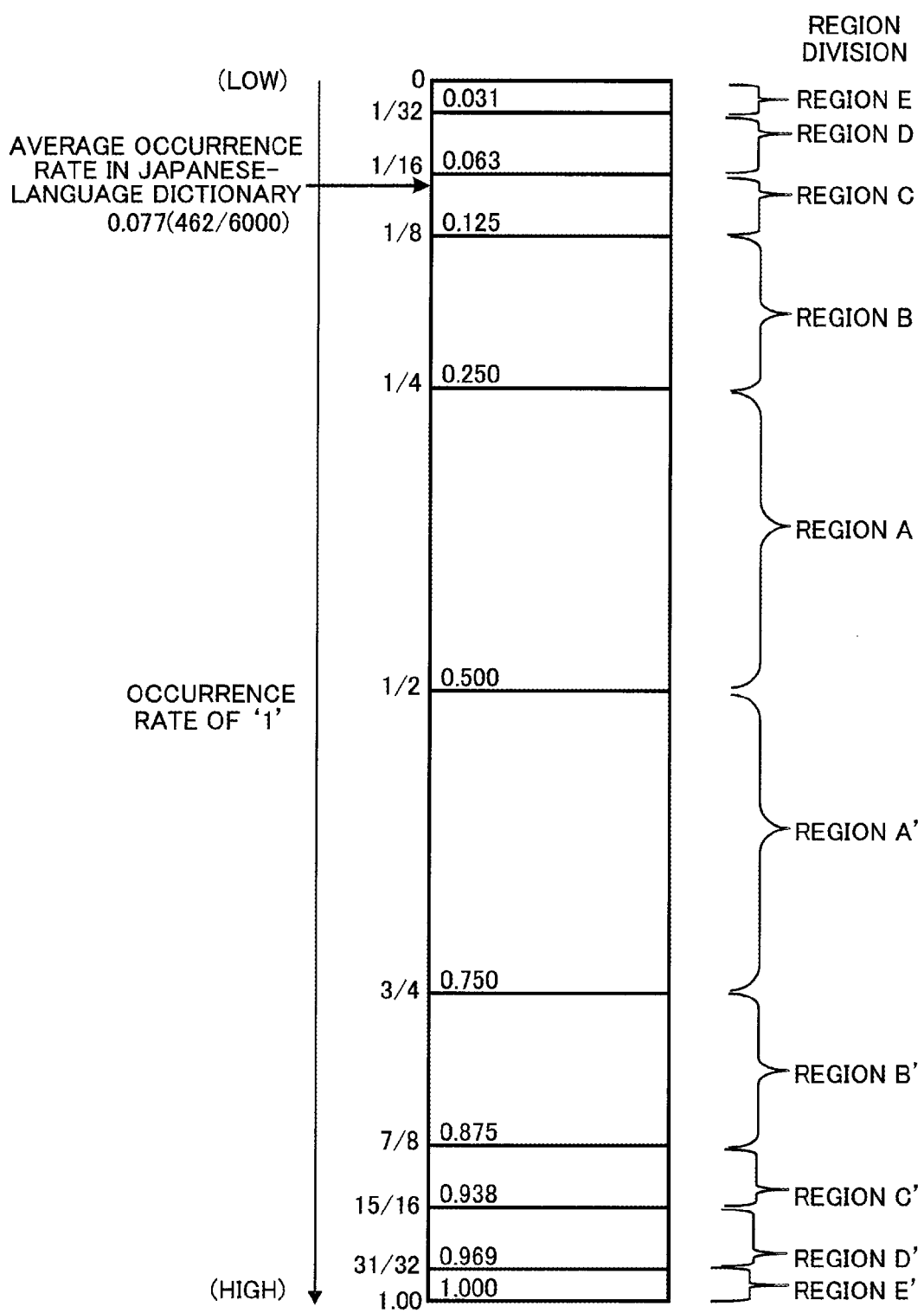
FIG. 12 illustrates an example of region division.

FIG. 12 illustrates an example of region division. According to the example of FIG. 12, a range with the occurrence rate of '1' being 0 or more and less than 1/32 (0.031) is Region E. A range with the occurrence rate of '1' being 1/32 (0.031) or more and less than 1/16 (0.063) is Region D. A range with the occurrence rate of '1' being 1/16 (0.063) or more and less than 1/8 (0.125) is Region C. A range with the occurrence rate of '1' being 1/8 (0.125) or more and less than 1/4 (0.250) is Region B. A range with the occurrence rate of '1' being 1/4 (0.250) or more and 1/2 (0.500) or less is Region A.

Further, a range with the occurrence rate of '1' being more than 1/2 (0.500) and 3/4 (0.750) or less is Region A'. A range with the occurrence rate of '1' being more than 3/4 (0.750) and 7/8 (0.875) or less is Region B'. A range with the occurrence rate of '1' being more than 7/8 (0.875) and 15/16 (0.938) or less is Region C'. A range with the occurrence rate of '1' being more than 15/16 (0.938) and 31/32 (0.969) or less is Region D'. A range with the occurrence rate of '1' being more than 31/32 (0.969) and 1.00 or less is Region E'.

The ten regions of FIG. 12 are arranged point-symmetrically about a point 0.5. That is, if Regions A', B', C', D', and E' are rotated 180 degrees around the center point 0.5, the regions coincide with Regions A, B, C, D, and E, respectively.

Each of Regions A', B', C', D', and E' has the same occurrence rate of '0' as its symmetrical counterpart when the bit string values before RLE are inverted. The inversion of the bit string values is a process of switching bit values from 0 to 1 and from 1 to 0. For example, when the bit string values of characters belonging to Region A' are inverted, the occurrence rate of '1' is ¼ or more and ½ or less, which is the same as that of Region A.

In view of this, as for characters belonging to Regions A', B', C', D', and E', the bit string values are inverted before applying RLE according to the second embodiment. Then, symbol strings obtained after RLE are effectively compressed using the same Huffman trees as for the symmetrical counterparts. Note that in the following description, each Regions A', B', C', D', and E' with the occurrence rate of '1' being more than ½ is referred to as the inverted region.

In Region A, the encoding unit bit strings concentrate on either '1' or '01'. Therefore, after RLE, the symbols 'α' and 'β' occur with high frequency and other symbols have low frequencies of occurrence. Sufficient compressibility may be obtained for characters belonging to Region A, for example, by representing the symbols 'α' and 'β' by one bit and two bits, respectively, and further compressibility may not be achieved by Huffman coding. Therefore, for the characters of Region A, Huffman coding may not be applied to symbol strings obtained by RLE. Note that in the case where Huffman coding actually improves the compressibility of the symbol strings obtained by RLE for the characters belonging to Region A, Huffman coding may be applied to the symbol strings.

In Region B, the encoding unit bit strings concentrate on '001' and '0001'. In this case, when RLE is applied, the symbol '1' occurs with high frequency. Therefore, symbol strings corresponding to characters belonging to Region B are compressed using Huffman coding assigning the shortest code to the symbol '1'.

Region C is concentrated with encoding unit bit strings ranging from '00001' to '00000001'. In this case, when RLE is applied, the symbol '2' occurs with high frequency. Therefore, symbol strings corresponding to characters belonging to Region C are compressed using Huffman coding assigning the shortest code to the symbol '2'.

Region D is concentrated with encoding unit bit strings ranging from '000000001' to '0000000000000001. In this case, when RLE is applied, the symbol '3' occurs with high frequency. Therefore, symbol strings corresponding to characters belonging to Region D are compressed using Huffman coding assigning the shortest code to the symbol '3'.

Region E is concentrated with encoding unit bit strings with sixteen or more runs of 0's. In this case, when RLE is applied, the symbol '4' occurs with high frequency. Therefore, symbol strings corresponding to characters belonging to Region E are compressed using Huffman coding assigning the shortest code to the symbol '4'.

In the above-described manner, a Huffman tree is generated for each of Regions A, B, C, D, and E, and then Huffman coding is applied. In this case, as each encoding unit bit string having a higher probability of occurrence includes a larger number of 0's, more effective compression is achieved by Huffman coding. Therefore, the compressibility improves in the following order: Regions A→B→C→D→E.

Next described is a procedure for generating an index for a group of records and compressing the index.

Figure 13:
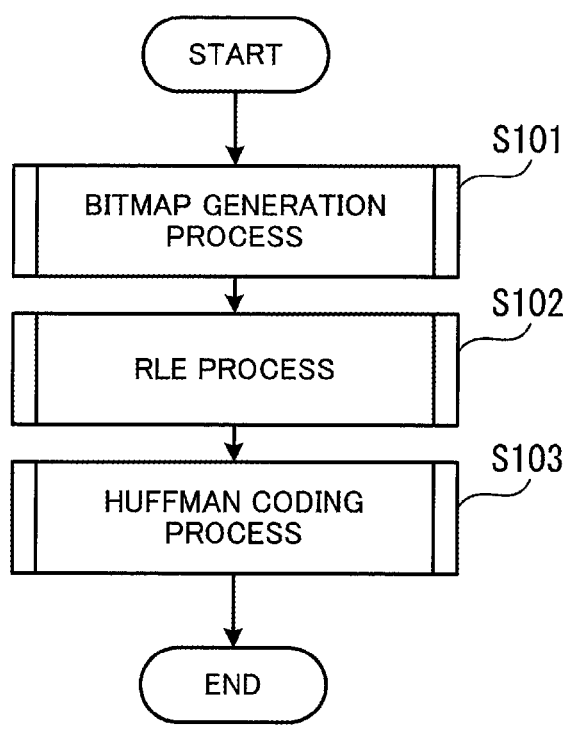
FIG. 13 is a flowchart illustrating an example of a procedure for generating and compressing an index.

FIG. 13 is a flowchart illustrating an example of a procedure for generating and compressing an index. The process of FIG. 13 is described next according to the step numbers in the flowchart.

[Step S101] The index generating unit 122 in the crawler 120 generates a bitmap indicating characters appearing in records. The details of the process are described later (see FIG. 14).

[Step S102] The index generating unit 122 carries out an RLE process on the bitmap. The details of the process are described later (see FIG. 16).

[Step S103] The index generating unit 122 carries out a Huffman coding process on symbol strings obtained by RLE. The details of the process are described later (see FIG. 18).

Next described are details of each of the processes in FIG. 13.

Figure 14:
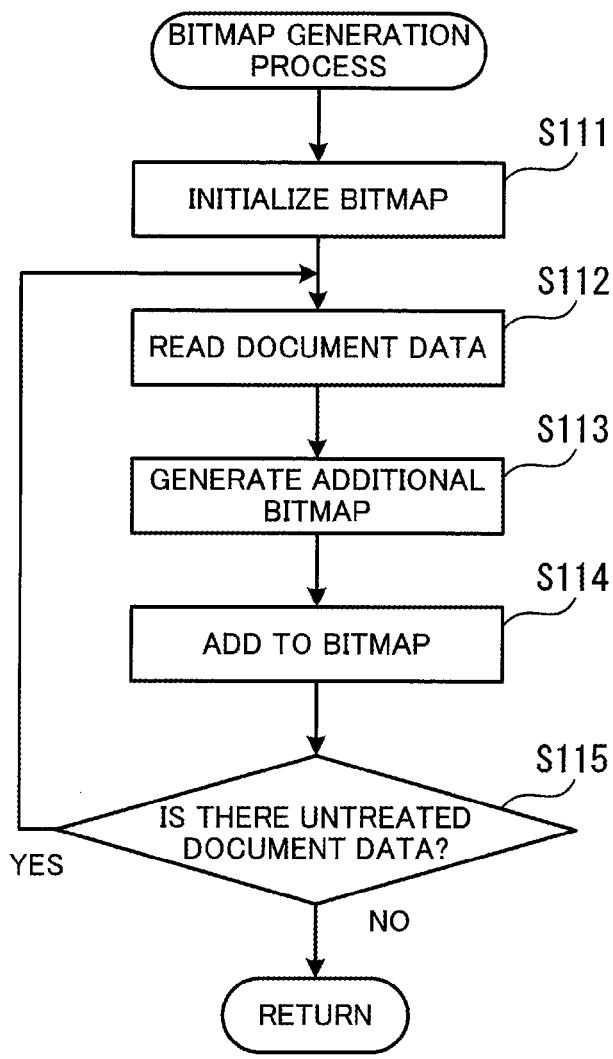
FIG. 14 is a flowchart illustrating an example of a procedure of a bitmap generation process.

FIG. 14 is a flowchart illustrating an example of a procedure of a bitmap generation process. The process of FIG. 14 is described next according to the step numbers in the flowchart.

[Step S111] The index generating unit 122 initializes the bitmap. For example, the index generating unit 122 creates a list of characters expressible in an encoding scheme being applied to the characters in the records. The index generating unit 122 stores the initialized bitmap, for example, in the index storing unit 140.

[Step S112] The index generating unit 122 reads one record for which an index content has yet to be created.

[Step S113] The index generating unit 122 generates an additional bitmap corresponding to the read record. For example, with respect to each character, the index generating unit 122 determines whether the character appears in the read record (i.e., determines the presence or absence of the character in the read record). As for each character appearing in the read record, the index generating unit 122 sets a value of 1 in association with the read record and the character. On the other hand, as for each character not appearing in the read record, the index generating unit 122 sets a value of 0 in association with the read record and the character. The index generating unit 122 writes, in the working memory 160, the value indicating the presence or absence of a character, for example, each time the determination of the presence or absence is made. Herewith, the additional bitmap 162 corresponding to the read record is established in the working memory 160 (see FIG. 6).

[Step S114] The index generating unit 122 adds the generated additional bitmap 162 to the uncompressed bitmap 142 of the index storing unit 140.

[Step S115] The index generating unit 122 determines whether there is still another record for which an index content has yet to be created. If there is still another record, the index generating unit 122 moves the procedure to step S112. If not, the index generating unit 122 ends the bitmap generation process.

FIG. 15 illustrates an example of an uncompressed bitmap. The bitmap 142 is provided with columns, for example, for character type, character, and global identifier (G-ID).

The character type column contains types of characters. The character column contains characters each serving as a label of a different row of the bitmap 142. The global identifier column contains global identifiers each serving as a label of a different column of the bitmap 142.

In the bitmap 142, the row of each character includes values each indicating the presence or absence of the character in a different file. For example, 1 is set in a position corresponding to the global identifier of a file in which the character appears, and 0 is set in a position corresponding to the global identifier of a file in which the character does not appear.

RLE is first applied to the uncompressed bitmap 142.

Figure 16:
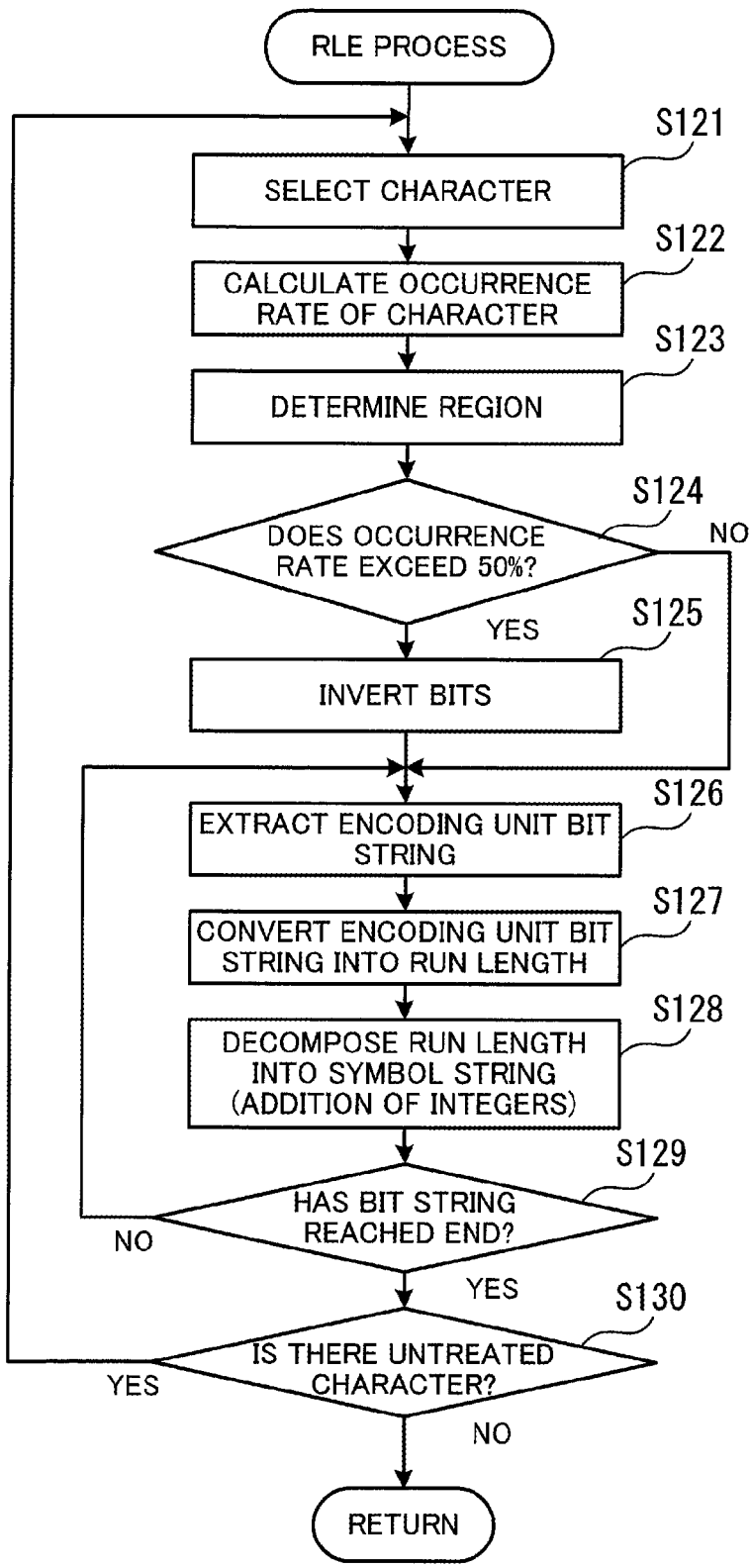
FIG. 16 is a flowchart illustrating an example of a procedure of an RLE process.

FIG. 16 is a flowchart illustrating an example of a procedure of an RLE process. The process of FIG. 16 is described next according to the step numbers in the flowchart.

[Step S121] The index generating unit 122 selects an untreated character from the bitmap 142.

[Step S122] The index generating unit 122 calculates the occurrence rate of the selected character. The index generating unit 122 uses, for example, a result obtained by dividing the number of 1's in the bit string of the selected character by the total number of records as the occurrence rate of the character. The index generating unit 122 sets the calculated occurrence rate, for example, in the management information 163 (see FIG. 6) in association with the character.

[Step S123] The index generating unit 122 determines a region to which the selected character belongs. The index generating unit 122 checks, for example, which one of the regions illustrated in FIG. 12 the occurrence rate of the selected character falls in, and determines an appropriate region as the region to which the character belongs. The index generating unit 122 sets the determined region in the management information 163, in association with the selected character.

[Step S124] The index generating unit 122 determines whether the occurrence rate of the selected character exceeds 50% (0.5). If the occurrence rate exceeds 50%, the index generating unit 122 moves the procedure to step S125. If the occurrence rate is 50% or less, the index generating unit 122 moves the procedure to step S126.

[Step S125] The index generating unit 122 inverts each bit value in the bit string corresponding to the selected character. That is, the index generating unit 122 switches the bit values from 0 to 1 and from 1 to 0.

[Step S126] The index generating unit 122 sequentially extracts an encoding unit bit string from the bit string corresponding to the selected character, starting from the beginning of the bit string. According to the example of FIG. 15, the leftmost bit (a bit corresponding to Global Identifier 1) of the bit string corresponding to each character is the beginning. For example, the index generating unit 122 searches for a bit of '1', starting from the beginning of the bit string. A partial bit string from the beginning of the bit string to the first bit value of '1' forms one encoding unit bit string. From the second round onward, the index generating unit 122 starts searching for the first bit value of '1' from a bit following a bit value of '1' detected in the previous search. Then, a partial bit string from the bit where the search is started to the first bit value of '1' forms one encoding unit bit string.

Note that, when having not detected a bit of '1' to the end of the bit string, the index generating unit 122, for example, extracts no encoding unit bit string and then moves the procedure to step S127.

[Step S127] The index generating unit 122 converts the extracted encoding unit bit string into a run length (the number of consecutive 0's) according to rules as illustrated in FIG. 11. Note that, in the case where a bit of '1' has not been detected to the end of the character string and thus no encoding unit bit string has been extracted, the index generating unit 122 adds, for example, the symbol [EOB] indicating a string end to the end of the symbol string. In this case, it is understood that values of bits ranging from a bit following the last bit of '1' to the end of the bit string are all 0.

[Step S128] The index generating unit 122 decomposes the run length into an addition of integers of 0 and/or power(s) of 2, to thereby convert the run length into a symbol string formed by arraying symbols corresponding to 0 and/or power(s) of 2 obtained by the decomposition.

[Step S129] The index generating unit 122 determines whether the bit string of the selected character has reached the end. For example, when a bit of 1 is not detected to the end of the character string in step S126, or when a detected bit of 1 is the last bit of the bit string, the index generating unit 122 determines that the bit string of the selected character has reached the end. If the bit string has reached the end, the index generating unit 122 moves the procedure to step S130. If not, the index generating unit 122 moves the procedure to step S126.

[Step S130] The index generating unit 122 determines whether there is still an untreated character in the bitmap 142. If there is an untreated character, the index generating unit 122 moves the procedure to step S121. On the other hand, if all the characters have been treated, the index generating unit 122 ends the RLE process. At this point in time, the index generating unit 122 stores, for example, the management information 163 of the working memory 160 in the index storing unit 140.

FIG. 17 illustrates an example of an index after RLE. In the index 141 created by encoding the bit strings with RLE, symbol strings generated by RLE are set in association with individual characters of each character type. In addition, in the management information 143, an occurrence rate and a region are set in association with each character.

Next described are details of the Huffman coding process.

Figure 18:
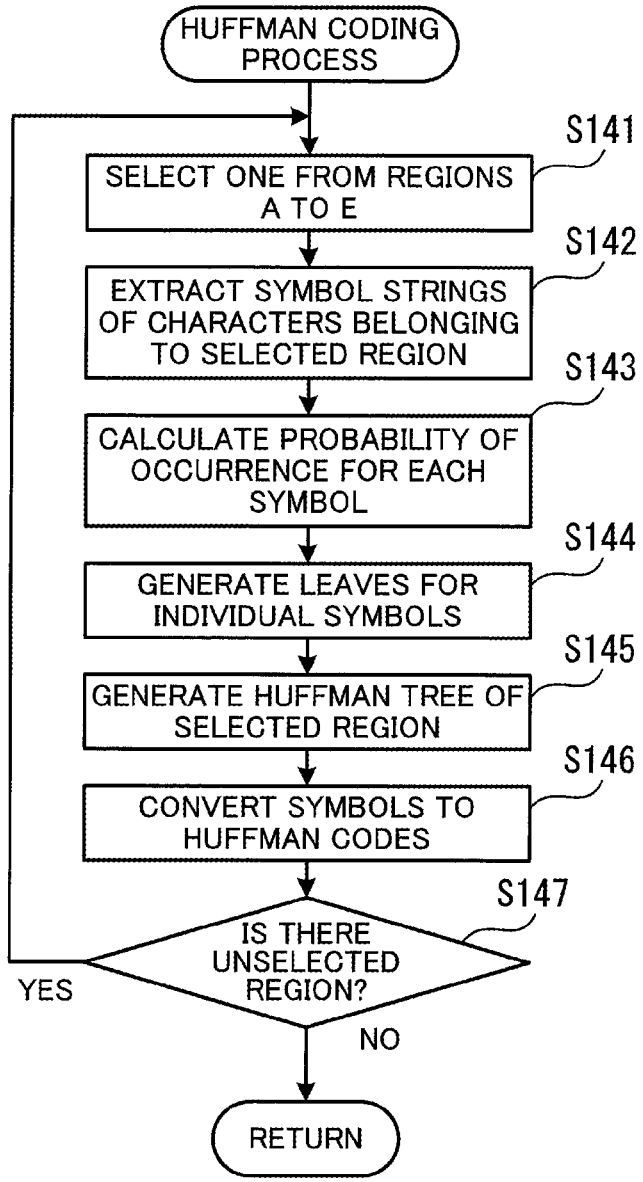
FIG. 18 is a flowchart illustrating an example of a procedure of a Huffman coding process.

FIG. 18 illustrates an example of a procedure of a Huffman coding process. The process of FIG. 18 is described next according to the step numbers.

[Step S141] The index generating unit 122 selects an untreated region amongst Regions A, B, C, D, and E.

[Step S142] The index generating unit 122 extracts, from the index 141, symbol strings of characters belonging to the selected region. At this point, the index generating unit 122 also extracts symbol strings of characters belonging to an inverted region corresponding to the selected region. For example, in the case where Region A is selected, symbol strings of characters belonging to either one of Region A and Region A' are extracted.

[Step S143] The index generating unit 122 calculates the probability of occurrence of each symbol in the extracted symbol strings. For example, the index generating unit 122 counts the number of occurrences of each of the symbols α, β, 1, 2, 3, . . . , and EOB included in the extracted symbol strings. Then, the index generating unit 122 divides the number of occurrences of each symbol by the total number of symbols included in the extracted symbol strings, and uses a result of the division as the probability of occurrence of the symbol. The number of occurrences of the symbol [EOB] indicating a string end is one for each symbol string corresponding to one character.

[Step S144] The index generating unit 122 generates leaves individually corresponding to the symbols. In this relation, the index generating unit 122 also generates a leaf corresponding to, for example, the symbol [EOB] indicating a string end. In each of the generated leaf structures, a corresponding symbol and the probability of occurrence of the symbol are set.

[Step S145] The index generating unit 122 generates a Huffman tree for the selected region. For example, the index generating unit 122 selects two leaves with the smallest probabilities of occurrence amongst the leaves generated in step S144. Then, the index generating unit 122 generates a new node and connects, with a branch, the node and each of the selected leaves located below the node. One of the branches is labeled as '0', and the other is labeled as '1'. A sum of the probabilities of occurrence of the selected two leaves is set in the generated node. From this point, the index generating unit 122 considers the generated node as a leaf. Then, the index generating unit 122 repeats selection of two leaves with the smallest probabilities of occurrence, generation of a node, connection of the leaves to the node until only one leaf is left without being connected below a node. A tree with a structure in which the last remaining leaf serves as a root of the tree is a Huffman tree.

[Step S146] The index generating unit 122 converts each symbol in the extracted symbol strings into a Huffman code according to the Huffman tree generated in step S145. For example, in order to encode a symbol, the index generating unit 122 follows the path from the root of the Huffman tree to a leaf corresponding to the symbol, and a string of labels attached to branches along the path becomes a Huffman code. Note that the index generating unit 122 stores the generated Huffman tree in association with the region, for example, in the working memory 160 as part of the management information 163.

[Step S147] The index generating unit 122 determines whether there is an unselected region amongst Regions A, B, C, D, and E. If there is still an unselected region, the index generating unit 122 moves the procedure to step S141. If there is no unselected region, the index generating unit 122 ends the Huffman coding process. At this point, the index generating unit 122 stores Huffman trees held in the management information 163 of the working memory 160, for example, in the index storing unit 140 as part of the management information 143.

In this manner, Huffman trees associated with individual regions are generated, and symbols generated by RLE are encoded using the Huffman trees each dedicated to a different region.

Figure 19:
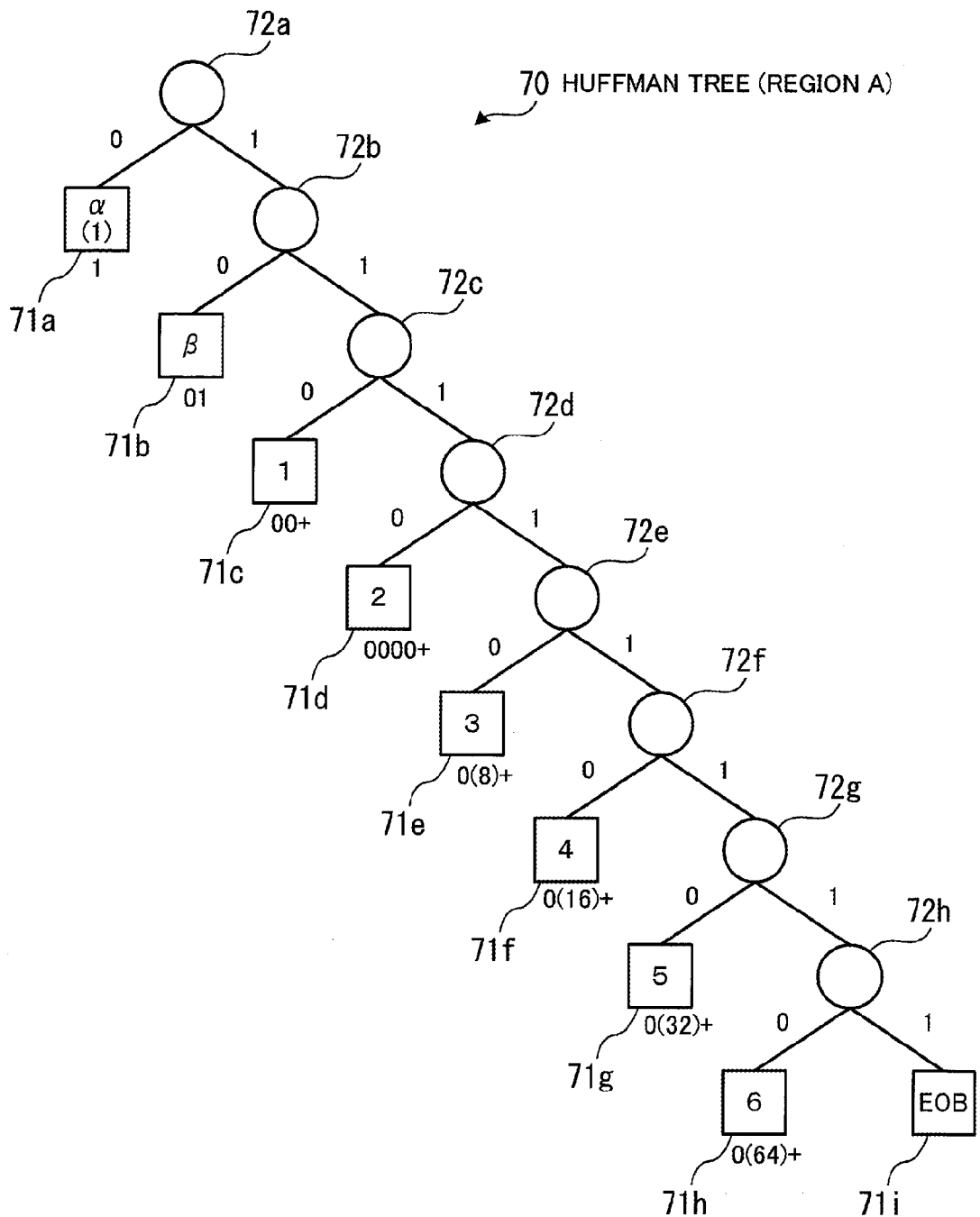
FIG. 19 illustrates a first example of a Huffman tree.

FIG. 19 illustrates a first example of a Huffman tree. FIG. 19 represents a Huffman tree 70 generated for Region A. The Huffman tree 70 includes a plurality of leaves 71*a*, 71*b*, 71*c*, 71*d*, 71*e*, 71*f*, 71*g*, 71*h*, and 71*i* and a plurality of nodes 72*a*, 72*b*, 72*c*, 72*d*, 72*e*, 72*f*, 72*g*, and 72*h*. The node 72*a* is the root of the Huffman tree 70.

The leaf 71*a* corresponds to the symbol 'α'; the leaf 71*b* corresponds to the symbol 'β'; the leaf 71*c* corresponds to the symbol '1'; the leaf 71*d* corresponds to the symbol '2'; the leaf 71*e* corresponds to the symbol '3'; the leaf 71*f* corresponds to the symbol '4'; the leaf 71*g* corresponds to the symbol '5' the leaf 71*h* corresponds to the symbol '6'; and the leaf 71*i* corresponds to the symbol [EOB].

Each of the leaves 71*a*, 71*b*, 71*c*, 71*d*, 71*e*, 71*f*, 71*g*, 71*h*, and 71*i* is located below a node and connected to the node by a branch. In addition, the nodes are connected to each other by branches. Two branches connect each of the nodes 72*a*, 72*b*, 72*c*, 72*d*, 72*e*, 72*f*, 72*g*, and 72*h* to leaves, or a leaf and a node, located below the node. One of the two branches below each node is labeled as '0', and the other is labeled as '1'.

A compressed code (Huffman code) of a symbol to be encoded is obtained by following a path from the node 72*a*, which is the root of the Huffman tree 70 with the above-described structure, to the symbol and arranging labels attached to branches along the path.

FIG. 20 illustrates a first example of compressed codes corresponding to symbols. The compressed codes of FIG. 20 are obtained by encoding symbols in the symbol strings corresponding to characters belonging to Region A using the Huffman tree 70 of FIG. 19.

According to the example of FIG. 20, the following information is associated with each symbol: bit string pattern; number of occurrences; probability of occurrence; corrected probability; remaining probability; compressed code length; and compressed code. The bit string pattern indicates a bit string of the symbol before RLE. The number of occurrences indicates the number of times that the symbol appears in symbol strings corresponding to all the characters belonging to Region A. The probability of occurrence indicates the probability of occurrence of the symbol in the symbol strings corresponding to all the characters belonging to Region A.

The corrected probability indicates the probability obtained by correcting a corresponding probability of occurrence to a value of a power of ½. The probability of occurrence is corrected, for example, to the largest value amongst powers of ½ less than the probability of occurrence. In the case where the probability of occurrence is 0.5203, values of $(½)^1$, $(½)^2$, and so on are less than 0.5203. Among them, the largest value is $(½)^1$, i.e., ½, and therefore the probability of occurrence of 0.5203 is corrected to ½ (i.e., the corrected probability is ½). The remaining probability indicates the probability obtained, when the corrected probability of each symbol is determined sequentially in descending order of the probability of occurrence, by subtracting a sum of corrected probabilities already determined by that point in time from 1.

The compressed code length indicates the bit number of a compressed code generated for the symbol. The compressed code indicates a compressed code of the symbol.

As for characters belonging to Region A, the occurrence rate of '1' in the bit strings is 0.25 to 0.5. Therefore, after RLE, the probabilities of occurrence of the symbols 'α' and 'β' become high. According to the example of FIG. 20, the symbol 'α' has the highest probability of occurrence. As a result, the symbol 'α' is encoded into the shortest compressed code '0'. As the probability of occurrence decreases further, a compressed code with a longer code length is assigned.

Other regions individually have a probability of occurrence of each symbol different from that of Region A. Therefore, a Huffman tree different from the Huffman tree 70 is generated for each of the other regions.

Figure 21:
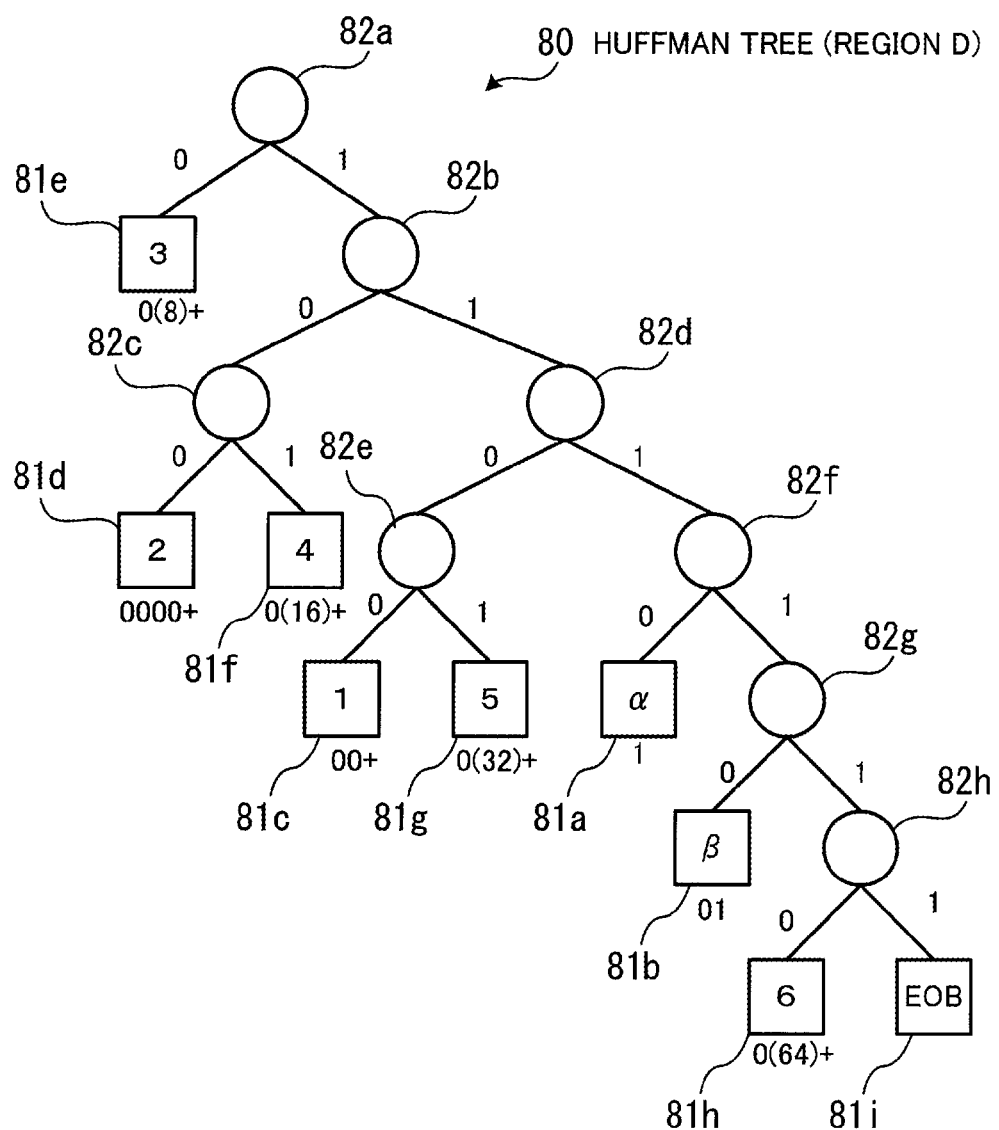
FIG. 21 illustrates a second example of the Huffman tree.

FIG. 21 illustrates a second example of a Huffman tree. FIG. 21 represents a Huffman tree 80 generated for Region D. The Huffman tree 80 includes a plurality of leaves 81*a*, 81*b*, 81*c*, 81*d*, 81*e*, 81*f*, 81*g*, 81*h*, and 81*i* and a plurality of nodes 82*a*, 82*b*, 82*c*, 82*d*, 82*e*, 82*f*, 82*g*, and 82*h*. The node 82*a* is the root of the Huffman tree 80.

The leaf 81*a* corresponds to the symbol 'α'; the leaf 81*b* corresponds to the symbol 'β'; the leaf 81*c* corresponds to the symbol '1'; the leaf 81*d* corresponds to the symbol '2'; the leaf 81*e* corresponds to the symbol '3'; the leaf 81*f* corresponds to the symbol '4'; the leaf 81*g* corresponds to the symbol '5' the leaf 81*h* corresponds to the symbol '6'; and the leaf 81*i* corresponds to the symbol [EOB].

Since Region D has a probability of occurrence of each symbol different from that of Region A, the generated Huffman tree 80 has a different structural form from the Huffman tree 70 of FIG. 19. Therefore, each symbol in symbol strings corresponding to characters belonging to Region D is encoded into a different compressed code from that of Region A.

FIG. 22 illustrates a second example of compressed codes corresponding to symbols. The compressed codes of FIG. 22 are obtained by encoding symbols in the symbol strings corresponding to characters belonging to Region D using the Huffman tree 80 of FIG. 21.

As for characters belonging to Region D, the occurrence rate of '1' in the bit strings is 0.0315 to 0.0625. Therefore, after RLE, the probabilities of occurrence of the symbols '2', '3', and '4' become higher than those of the symbols 'α' and 'β'. According to the example of FIG. 22, the symbol '3' has the highest probability of occurrence. As a result, the symbol '3' is encoded into the shortest compressed code '0'. As the probability of occurrence decreases further, a compressed code with a longer code length is assigned.

The original bit string corresponding to the symbol '3' is eight bits of '00000000'. That is, in Region D, the eight-bit bit string is compressed into the one-bit compressed code. Furthermore, in Region D, such highly compressible bit strings appear frequently, and high compressibility is therefore expected.

The index 141 in a compression format is generated by encoding symbol strings corresponding to characters belonging to each region using a Huffman tree dedicated to the region.

FIG. 23 illustrates an example of an index in a compression format. In the index 141, compressed code strings are set in association with individual characters each classified according to the character type. The compressed code strings are generated by converting the symbols in the symbol strings of FIG. 17 into Huffman codes.

With reference to the management information 143 of FIG. 17, for example, a hiragana character 141a belongs to Region A'. Characters belonging to Region A' are encoded using the same Huffman tree dedicated to Region A. The symbol string corresponding to the character 141a starts with '2β'. With reference to FIG. 20, the symbol '2' is encoded into a compressed code '1110' and the symbol 'β' is encoded into a compressed code '10'. Therefore, '2β' is encoded into '111010'.

In the above-described manner, the index is compressed, which allows the index to be stored in lower-capacity memory. The index compression technique according to the second embodiment is useful, for example, to store dictionary data in a mobile terminal and carry out a search using an index.

Next described is a procedure of a full-text search process performed by the searcher 130 (see FIG. 4).

Figure 24:
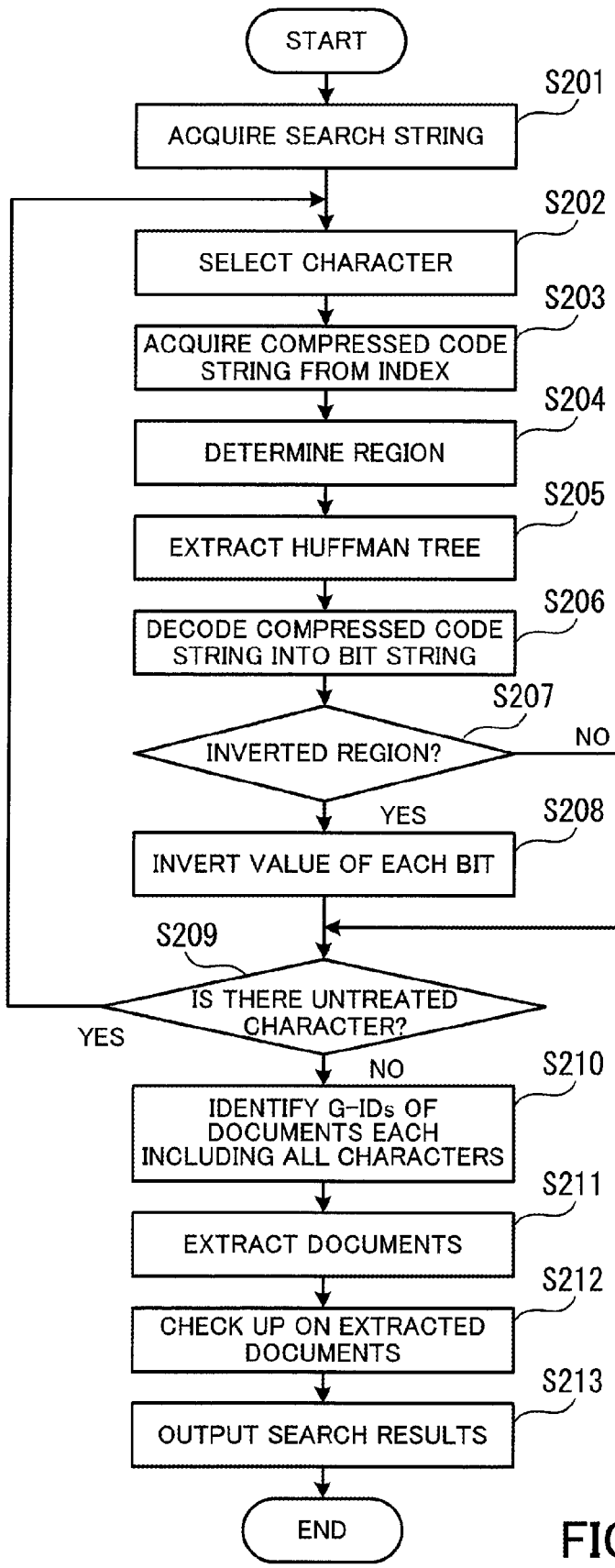
FIG. 24 is a flowchart illustrating an example of a procedure of a full-text search process.

FIG. 24 is a flowchart illustrating an example of a procedure of a full-text search process. The process of FIG. 24 is described next according to the step numbers in the flowchart.

[Step S201] The searcher 130 acquires a search string sent, for example, from the terminal 21.

[Step S202] The searcher 130 selects one unselected character amongst characters included in the search string.

[Step S203] The searcher 130 acquires a compressed code string corresponding to the selected character from the index 141 of the index storing unit 140.

[Step S204] The searcher 130 determines a region to which the selected character belongs. For example, the searcher 130 acquires, from the management information 143, information (see FIG. 17) indicating correspondence between characters and regions and determines the region to which the selected character belongs based on the information.

[Step S205] The searcher 130 extracts a Huffman tree dedicated to the region to which the selected character belongs, from a plurality of Huffman trees stored in the index storing unit 140 as part of the management information 143.

[Step S206] The searcher 130 decodes the compressed code string of the selected character into a bit string using the extracted Huffman tree. For example, the searcher 130 selects a bit of the compressed code string sequentially from the beginning. The searcher 130 then follows the tree structure of the extracted Huffman tree, sequentially from the root node to a leaf or node connected by a branch to which a label corresponding to a value of the selected bit is attached. When having reached a node, the searcher 130 follows the tree structure from the node to a leaf or node connected by a branch to which a label corresponding to a value of the next bit is attached. In this manner, the searcher 130 follows the tree structure of the Huffman tree according to the bit values of the compressed code string. Then, when having reached a leaf, the searcher 130 converts a compressed code corresponding to the labels of all the branches followed from the root to the leaf into a bit string indicated by a symbol associated with the leaf.

This conversion of a compressed code into a bit string is repeated for all compressed codes in the compressed code string corresponding to the selected character. Note that, when having reached a leaf associated with the symbol [EOB] indicating a string end, for example, the searcher 130 adds bits of 0's after a bit string obtained from the last conversion iteration until the length of the bit string restored by decoding matches the number of records.

[Step S207] The searcher 130 determines whether the region to which the selected character belongs is an inverted region (Region A', B', C', D', or E'). If it is an inverted region, the searcher 130 moves the procedure to step S208. If not, the searcher 130 moves the procedure to step S209.

[Step S208] The searcher inverts each bit value in the bit string restored in step S206 by decoding. That is, the searcher 130 switches the bit values from 0 to 1 and from 1 to 0.

[Step S209] The searcher 130 determines whether there is still an untreated character in the characters of the search string. If there is an untreated character, the searcher 130 moves the procedure to step S202. On the other hand, if all the characters have been treated, the searcher 130 moves the procedure to step S210.

[Step S210] Based on the restored bit strings, the searcher 130 identifies global identifiers of records in each of which all the characters of the search string appear. Each of the records in which all the characters of the search string appear is a record for which '1' is set in the restored bit strings of all the characters.

Assume, for example, that the search string is 'mori', 'ou', 'gai' and the bit strings 61 to 63 of FIG. 8 are restored by decoding. According to the example of FIG. 8, the $9^{th}$ bit value is '1' in all the bit strings. Therefore, Global Identifier 9 of the $9^{th}$ record is identified as the global identifier of a record in which all the characters in the search string appear.

[Step S211] The searcher 130 reads, from the index storing unit 140, a bitmap of the characters included in the search string, and narrows down corresponding global identifiers. The searcher 130 extracts records corresponding to the identified global identifiers from the compressed data storing unit 150. For example, in the management information 143, individual global identifiers are set in association with addresses of records corresponding to the global identifiers, within the compressed data storing unit 150. By referring to the management information 143, the searcher 130 determines addresses corresponding to the identified global identifiers and acquires compressed data stored at the determined addresses from the compressed data storing unit 150. Then, the searcher 130 decodes the acquired compressed data, and thereby acquires records in a plain text format.

[Step S212] The searcher 130 checks up on the search string in the extracted records.

[Step S213] The searcher 130 outputs search results. For example, the searcher 130 transmits, to the terminal 21 as the search results, global identifiers of records each including the search string, titles of the records, sentences including the search string and so on. Herewith, the search results are displayed on a screen of the terminal 21.

In the above-described manner, full-text search using the index 141 is achieved.

As described above, according to the second embodiment, each encoding unit bit string is decomposed into predetermined bit string patterns, and the obtained bit string patterns are assigned to the leaves of a Huffman tree. In this manner, the number of leaves is reduced, which facilitates fast Huffman tree generation and high-speed encoding and decoding using Huffman trees.

In addition, according to the second embodiment, the compression process is performed after bit string patterns are replaced with symbols, and therefore a bitmap is read only once. Such one-pass bitmap reading contributes to high-speed compression. For example, in the case where bit string patterns are not replaced with symbols, in the first bitmap reading, the frequencies of '0' and '1' for each character are calculated to thereby determine a region to which the character belongs. Subsequently, the bitmap is read for the second time, and Huffman coding is applied. On the other hand, according to the second embodiment, a bitmap is read to calculate the frequencies of '0' and '1' for each character, and bit strings are converted into symbol strings at the time of determining a region of each character. Then, based on the symbol strings, Huffman coding is carried out. Because the data volume of the symbol strings is reduced compared to the bitmap, it takes less time to read the symbol strings from memory. As a result, high-speed compression is achieved.

Third Embodiment

Next described is a third embodiment. The third embodiment uses nodeless trees as encoding trees, in place of the Huffman trees of the second embodiment. Note that the system configuration of the third embodiment is the same as that of the second embodiment illustrated in FIGS. 2 and 3. In addition, the functional components of an application server of the third embodiment are the same as those of the second embodiment illustrated in FIGS. 4 and 6. Therefore, with the use of like reference numerals referring to like elements in the second embodiment, the third embodiment is described next, focusing on different functions from those of the second embodiment.

According to the third embodiment, the crawler 120 compresses an index using nodeless trees in place of Huffman trees. In addition, the searcher 130 decompresses an index using nodeless trees in place of Huffman trees.

As in the case of a Huffman tree, a nodeless tree assigns shorter codes to symbols with higher frequencies of occurrence. Note however that, in a Huffman tree, a plurality of nodes are provided below the root, whereas, in a nodeless tree, no nodes are provided below the root and all leaves below the root are directly connected to the root. The use of nodeless trees having such a structure allows compressed codes to be decompressed by one pass, thus improving decompression speed.

When a nodeless tree is generated, the code length used to encode each symbol is determined according to the probability of occurrence of the symbol. For example, the index generating unit 122 of the crawler 120 counts the number of occurrences of each symbol and obtains its probability of occurrence, as illustrated in FIGS. 20 and 22. Subsequently, the index generating unit 122 obtains the corrected probability based on the frequency of occurrence. The corrected probability is, for example, the largest power of ½ less than or equal to the probability of occurrence. In the case where the frequency of occurrence is 0.137 which is less than ¼ (0.25) but more than ⅛ (0.125), the frequency of occurrence of 0.137 is corrected to ⅛.

Next, based on the corrected probability, the index generating unit 122 obtains the code length which is the bit number of a code. For example, an exponent obtained when the corrected probability is expressed as a power of ½ is used as the code length. If the corrected probability is ⅛ which is (½)³, the code length is 3 bits.

The index generating unit 122 determines a compressed code of each integer based on the code length obtained according to the frequency of occurrence of the symbol. For example, the compressed code is '000' when the code length is 3 bits, and the compressed code is '0010' when the code length is 4 bits. Thus, compressed codes similar to those of FIGS. 20 and 22 are generated.

Based on such correspondence between the symbols and the compressed codes, a nodeless tree is generated. For example, when the compressed codes of FIG. 22 are determined, a nodeless tree illustrated in FIG. 25 is generated.

Figure 25:
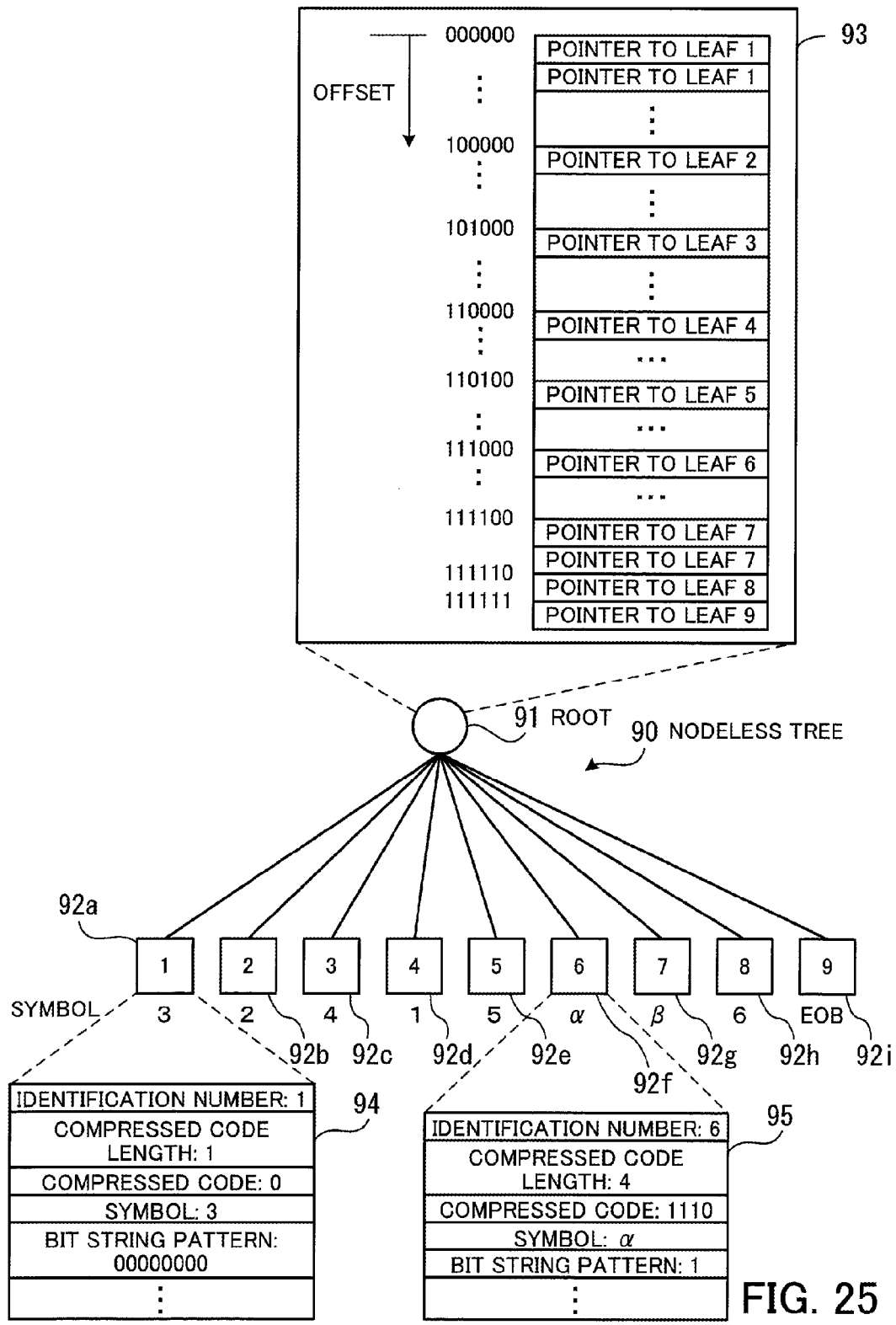
FIG. 25 illustrates an example of a nodeless tree.

FIG. 25 illustrates an example of a nodeless tree. A nodeless tree 90 includes a root 91 and a plurality of leaves 92a, 92b, 92c, 92d, 92e, 92f, 92g, 92h, and 92i. The leaves 92a, 92b, 92c, 92d, 92e, 92f, 92g, 92h, and 92i are disposed immediately below the root 91, and no nodes, like those in a Huffman tree, are present. In FIG. 25, the leaves 92a, 92b, 92c, 92d, 92e, 92f, 92g, 92h, and 92i are given identification numbers 1, 2, 3, 4, 5, 6, 7, 8, and 9, sequentially from the left.

In a root structure 93, pointers to the leaves 92a, 92b, 92c, 92d, 92e, 92f, 92g, 92h, and 92i are set in individual regions each corresponding to 6-bit addresses. Each of leaf structures 94 and 95 includes, for example, the following information: identification number of the corresponding leaf 92a/92f; compressed code length; compressed code; symbol; and bit string pattern.

In the root structure 93, more pointers are assigned to a leaf with shorter code length. For example, as for the leaf 92a, the compressed code length is 1 bit and the compressed code is '0'. In this case, pointers to the leaf 92a are set in all regions with addresses ranging from '000000' to '011111'. The compressed code length of the leaf 92f is 4 bits. In this case, pointers to the leaf 92f are set in all regions with addresses ranging from '111000' to '111011'.

The nodeless tree 90 having the above-described configuration allows one-pass decoding. For example, the searcher 130 acquires the first six-bit values of a code string to be decoded, and references a pointer stored in a region determined by using the acquired value as an offset from the beginning of the root structure 93. Next, the searcher 130 references a leaf structure indicated by the referenced pointer. Then, the searcher 130 decodes, among the acquired six bits, beginning bits as many as a bit number of the compressed code length indicated in the referenced leaf structure into a bit string pattern indicated by the referenced leaf structure. Subsequently, the searcher 130 acquires again next six-bit values of the code string and decodes them in the same manner.

Assume here that the acquired six-bit value is '111000' and a region determined by using the value as an offset is referenced. The region stores a pointer to the leaf structure 95 corresponding to the leaf 92f. The leaf structure 95 indicates that the compressed code length is 4 bits and the bit string pattern for decoding is '1'. Therefore, the searcher 130 decodes, among the six-bit value '111000', the first 4 bits '1110' into the bit string pattern '1'.

Thus, decoding with the use of the nodeless tree 90 allows a target leaf to be detected by one pass from the root 91. More specifically, with the nodeless tree 90, a leaf structure is acquired not after making a determination for each bit of the compressed data but in a single determination for a set of 6 bits. This eliminates the need of multiple determinations to follow nodes from the root, which is the case of a Huffman tree, and it is therefore possible to decompress compressed codes at high speed.

Next described is an example in which an index of dictionary data in bitmap format is actually compressed according to the third embodiment. Note that, in the following example, the corrected probabilities obtained by correcting the individual probabilities of occurrence to powers of ½ are further corrected in order to improve the compressibility. Such correction is called here second-order correction. The second-order correction is a process of modifying the corrected probabilities of individual symbols to larger values in such a manner that the sum of the corrected probabilities does not exceed 1. Note that the corrected probabilities after the second-order correction are also powers of ½. For example, the searcher 130 selects a symbol and then determines whether the sum of the corrected probabilities of all the symbols exceeds 1 when the corrected probability of the selected symbol obtained based on its probability of occurrence is doubled. If the sum does not exceed 1, the searcher 130 corrects the corrected probability of the selected symbol to the doubled value.

A higher corrected probability of a symbol further shortens the code length of a compressed code corresponding to the symbol, which increases the compressibility.

Next described is a compression example in which an index of a Japanese-language dictionary in bitmap format is compressed. In the following example, the overall range of the occurrence rate of '1' is more finely divided than the example of FIG. 12, into sixteen regions. Here, Regions E and E' are subdivided whilst Regions A to D and A' to D' remain the same as those in FIG. 12. A range with the occurrence rate of '1' being 0 or more and less than $1/256$ is Region H. A range with the occurrence rate of '1' being $1/256$ or more and less than $1/128$ is Region G. A range with the occurrence rate of '1' being $1/128$ or more and less than $1/64$ is Region F. A range with the occurrence rate of '1' being $1/64$ or more and less than $1/32$ is Region E. A range with the occurrence rate of '1' being more than $31/32$ and $63/64$ or less is Region E'. A range with the occurrence rate of '1' being more than $63/64$ and $127/128$ or less is Region F'. A range with the occurrence rate of '1' being more than $127/128$ and $255/256$ or less is Region G'. A range with the occurrence rate of '1' being more than $255/256$ and 1 or less is Region H'.

As for Regions A' to H', the bit string values are inverted and then encoded as Regions A to H, respectively. An example of compression results of Regions A to H is illustrated in FIGS. 26 to 33.

In each of FIGS. 26 to 33, the following information is associated with respect to each symbol: bit length; number of occurrences; bit size; and probability of occurrence. The bit length is the bit number of a bit string pattern corresponding to the symbol. The number of occurrences is the number of times that a bit string pattern corresponding to the symbol occurs in bit strings of characters belonging to a corresponding region. The bit size is the total bit number of a bit string pattern corresponding to the symbol, within the bit strings of characters belonging to a corresponding region. The bit size is calculated by multiplying the number of occurrences of the symbol by the bit length of the symbol. The probability of occurrence is the probability that a bit string pattern within the bit strings of characters belonging to a corresponding region is a bit string pattern corresponding to the symbol.

In each of FIGS. 26 to 33, the following information is also associated with each symbol in the cases with and without second-order correction: corrected probability, code length, and code size. The corrected probability in the case without second-order correction is the largest power of ½ less than or equal to the probability of occurrence of the symbol. The corrected probability of each symbol in the case with second-order correction may be the same as the corrected probability of the symbol without second-order correction, or may be a value obtained by doubling the corrected probability of the symbol without second-order correction as long as the sum of the corrected probabilities of all symbols does not exceed 1. The code length is the code bit number determined according to a corrected probability of the symbol. The code size is the total code bit number obtained when each bit string pattern corresponding to the symbol within the bit strings of characters belonging to a corresponding region is encoded according to a corrected probability of the symbol. The code size is calculated by multiplying the number of occurrences of the symbol by the code length of the symbol.

Further, each of FIGS. 26 to 33 includes compressibilities for the cases with and without the second-order correction. The compressibility indicates a proportion of the total compressed size in relation to characters belonging to a corresponding region to its total uncompressed size. The compressibility is calculated by dividing the sum of the code size by the sum of the bit size.

FIG. 26 illustrates an example of compression results of Region A. As for the compression for Region A, a bit string pattern with a shorter bit length has a higher probability of occurrence. Therefore, without the second-order correction, the compressibility exceeds 1. With the second-order correction, the corrected probability corresponding to the symbol 'β' is corrected from 0.1250 to 0.2500. Herewith, the code length of a code corresponding to a bit string pattern of the symbol 'β' is shortened from 3 bits to 2 bits. In addition, the corrected probability corresponding to the symbol '3' is corrected from 0.0156 to 0.0313. Herewith, the code length of a code corresponding to a bit string pattern of the symbol '3' is shortened from 6 bits to 5 bits. Similarly, as for each of the symbols '4' to '9', the corrected probability is doubled by the second-order correction and thereby the code length is shortened. As a result, when encoding is performed with the code lengths determined based on the corrected probabilities after the second-order correction, a compressibility of about 0.9 is achieved.

FIG. 27 illustrates an example of compression results of Region B. As for the compression for Region B, as is the case with Region A, a bit string pattern with a shorter bit length has a higher probability of occurrence. Note however that Region B has an increased proportion of bit string patterns with long bit lengths compared to Region A. As a result, even without the second-order correction, a compressibility of about 0.86 is achieved. With the second-order correction, the compressibility is further reduced to about 0.72.

FIG. 28 illustrates an example of compression results of Region C. As for the compression for Region C, as is the case with Regions A and B, a bit string pattern with a shorter bit length has a higher probability of occurrence. Note however that Region C has even an increased proportion of bit string patterns with long bit lengths compared to Region B. As a result, even without the second-order correction, a compressibility of about 0.60 is achieved. With the second-order correction, the compressibility is further reduced to about 0.52.

FIG. 29 illustrates an example of compression results of Region D. As for the compression for Region D, as is the case with Regions A, B and C, a bit string pattern with a shorter bit length has a higher probability of occurrence. Note however that Region D has even an increased proportion of bit string patterns with long bit lengths compared to Region C. As a result, even without the second-order correction, a compressibility of about 0.38 is achieved. With the second-order correction, the compressibility is further reduced to about 0.34.

FIG. 30 illustrates an example of compression results of Region E. As for the compression for Region E, as is the case with Regions A, B, C and D, a bit string pattern with a shorter bit length has a higher probability of occurrence. Note however that Region E has even an increased proportion of bit string patterns with long bit lengths compared to Region D. As a result, even without the second-order correction, a compressibility of about 0.23 is achieved. With the second-order correction, the compressibility is further reduced to about 0.21.

FIG. 31 illustrates an example of compression results of Region F. As for the compression for Region F, as is the case with Regions A, B, C, D and E, a bit string pattern with a shorter bit length has a higher probability of occurrence. Note however that Region F has even an increased proportion of bit string patterns with long bit lengths compared to Region E. As a result, even without the second-order correction, a compressibility of about 0.14 is achieved. With the second-order correction, the compressibility is further reduced to about 0.13.

FIG. 32 illustrates an example of compression results of Region G. As for the compression for Region G, as is the case with Regions A, B, C, D, E and F, a bit string pattern with a shorter bit length has a higher probability of occurrence. Note however that Region G has even an increased proportion of bit string patterns with long bit lengths compared to Region F. As a result, even without the second-order correction, a compressibility of about 0.09 is achieved. With the second-order correction, the compressibility is further reduced to about 0.08.

FIG. 33 illustrates an example of compression results of Region H. As for the compression for Region H, as is the case with Regions A, B, C, D, E, F and G, a bit string pattern with a shorter bit length has a higher probability of occurrence. Note however that Region H has even an increased proportion of bit string patterns with long bit lengths compared to Region G. As a result, even without the second-order correction, a compressibility of about 0.020 is achieved. With the second-order correction, the compressibility is further reduced to about 0.018.

Thus, bit string patterns in a bitmap is encoded by a coding system assigning shorter codes to elements with higher probabilities of occurrence, which achieves compression of an index in bitmap format with high compressibility.

Other Embodiments

According to the second embodiment, the bit string patterns are defined as bit strings each including the number of consecutive 0's being a power of 2. However, the bit string patterns may be defined by a different rule. For example, the bit string patterns are defined as bit strings each including the number of consecutive 0's being a power of 3. In this case, in addition to the symbol 'α' indicating the bit string '1' and the symbol 'β' indicating the bit string '01', a symbol 'γ' indicating a bit string '001' is defined. In addition, the number of consecutive bits of 0's is expressed using an exponent of the base 3 as a symbol. Herewith, each of all the encoding unit bit strings (zero or more consecutive 0's and 1) is expressed by a combination of the symbols.

In addition, according to the second embodiment, the inversion of bit string values is applied to high-frequency characters each having an occurrence rate of more than 0.5. However, the inversion of bit string values may be applied to low-frequency characters each having an occurrence rate of 0.5 or less. In this case, dedicated Huffman trees are generated, not for Regions A to E, but for Regions A' to E'.

According to the second embodiment, compression is applied to a bitmap indicating the presence and absence of each character in individual records, however, data in a different format may be compressed in a similar manner. For example, compression may be applied to bitmap data obtained by reading an image by an image scanner.

In addition, the processing functions described in each of the embodiments above may be achieved by a computer. In this case, a program is provided which describes processing contents of the functions to be implemented by the application server 100. By executing the program on the computer, the above-described processing functions are achieved on the computer. The program in which the processing contents are described may be recorded on computer-readable storage media. Such computer-readable storage media include a magnetic storage device, an optical disk, a magneto-optical storage medium, and a semiconductor memory. Examples of the magnetic storage device are a HDD, a flexible disk (FD), and a magnetic tape. Examples of the optical disk are a DVD, a DVD-RAM, a CD-ROM, and a CD-RW. An example of the magneto-optical storage medium is a magneto-optical disk (MO). Note that transitory propagating signals per se are not considered here as a computer-readable storage medium.

To distribute the program, for example, portable storage media, such as DVDs and CD-ROMs, on which the program is recorded are sold. In addition, the program may be stored in a memory device of a server computer and then transferred from the server computer to another computer via a network.

A computer for executing the program stores, for example, in its own memory device, the program which is originally recorded on a portable storage medium or transferred from the server computer. Subsequently, the computer reads the program from its own memory device and performs processing according to the program. Note that the computer is able to read the program directly from the portable storage medium and perform processing according to the program. In addition, the computer is able to sequentially perform processing according to a received program each time such a program is transferred from a server computer.

In addition, at least part of the above-described processing functions may be achieved by an electronic circuit, such as a digital signal processor (DSP), an application specific integrated circuit (ASIC), and a programmable logic device (PLD).

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that various changes, substitutions, and alterations could be made hereto without departing from the spirit and scope of the invention.

What is claimed is:

1. A non-transitory computer-readable recording medium storing therein an encoding program that causes a computer to execute a process comprising:

encoding, within compression target data, each part with a sequence of a same value into a count of consecutive runs of the value;

decomposing the count of consecutive runs of the value into an addition of integers belonging to a predetermined integer group;

calculating a probability of occurrence of each of the integers obtained by the decomposing; and encoding each of the integers by assigning a shorter code to an integer with a higher probability of occurrence.

2. The non-transitory computer-readable recording medium according to claim 1, wherein:

the integer group includes 0 and powers of a specific integer, and the encoding each of the integers includes using, for the encoding, a coding tree having leaves each corresponding to a different one of the integers.

3. The non-transitory computer-readable recording medium according claim 1, wherein:

the compression target data is a set of bit strings each indicating whether a corresponding one of a plurality of characters is present or absence in each of a plurality of records including character strings, the process further includes classifying each of the characters into one of a plurality of groups according to a proportion of bit values indicating the presence of the character in the corresponding bit string, the calculating includes calculating, with respect to each of the groups, the probability of occurrence of each of the integers based on the bit strings corresponding to the characters belonging to the group, and the encoding each of the integers includes encoding, with respect to each of the groups, the integers obtained from the bit strings corresponding to the characters belonging to the group according to the probability of occurrence of each of the integers calculated for the group.

4. The non-transitory computer-readable recording medium according to claim 3, wherein:

the process further includes inverting bit values of the bit strings corresponding to the characters belonging to one of a first range and a second range, the proportion exceeding 50 percent in each of the bit strings corresponding to the characters belonging to the first range, and the proportion being 50 percent or less in each of the bit strings corresponding to the characters belonging to the second range, and the encoding each part with a sequence of a same value includes using the inverted bit values to encode, for the characters corresponding to the bit strings with the inverted bit values, each part with the sequence of the same value into the count of consecutive runs of the value within the compression target data.

5. An encoding method comprising:

encoding, by a processor, within compression target data, each part with a sequence of a same value into a count of consecutive runs of the value;

decomposing, by the processor, the count of consecutive runs of the value into an addition of integers belonging to a predetermined integer group;

calculating, by the processor, a probability of occurrence of each of the integers obtained by the decomposing; and encoding, by the processor, each of the integers by assigning a shorter code to an integer with a higher probability of occurrence.

6. An information processing apparatus comprising:

a processor configured to perform a process including:

encoding, within compression target data, each part with a sequence of a same value into a count of consecutive runs of the value;

decomposing the count of consecutive runs of the value into an addition of integers belonging to a predetermined integer group;

calculating a probability of occurrence of each of the integers obtained by the decomposing; and encoding each of the integers by assigning a shorter code to an integer with a higher probability of occurrence.

* * * * *